United States Patent
Lewis et al.

(10) Patent No.: US 9,400,382 B2
(45) Date of Patent: Jul. 26, 2016

(54) CIRCUITS FOR CONTROLLING DISPLAY APPARATUS

(71) Applicant: Pixtronix, Inc., San Diego, CA (US)

(72) Inventors: Stephen R. Lewis, Reading, MA (US); Stephen English, Billerica, MA (US); Abraham McAllister, Annandale, VA (US)

(73) Assignee: Pixtronix, Inc., San Diego, CA (US)

( * ) Notice: Subject to any disclaimer, the term of this patent is extended or adjusted under 35 U.S.C. 154(b) by 0 days.

(21) Appl. No.: 14/741,874

(22) Filed: Jun. 17, 2015

(65) Prior Publication Data

US 2015/0286047 A1    Oct. 8, 2015

Related U.S. Application Data

(63) Continuation of application No. 12/652,477, filed on Jan. 5, 2010, now Pat. No. 9,082,353.

(51) Int. Cl.
| | |
|---|---|
| *G09G 3/34* | (2006.01) |
| *G02B 26/04* | (2006.01) |
| *G02B 26/08* | (2006.01) |
| *G09G 3/20* | (2006.01) |
| *H03K 3/037* | (2006.01) |

(52) U.S. Cl.
CPC ............ *G02B 26/04* (2013.01); *G02B 26/0841* (2013.01); *G09G 3/2003* (2013.01); *G09G 3/2022* (2013.01); *G09G 3/2074* (2013.01); *G09G 3/346* (2013.01); *G09G 3/3413* (2013.01); *G09G 3/3433* (2013.01); *H03K 3/037* (2013.01); *G09G 2300/0456* (2013.01); *G09G 2300/08* (2013.01); *G09G 2300/0814* (2013.01); *G09G 2300/0842* (2013.01); *G09G 2300/0857* (2013.01); *G09G 2310/0235* (2013.01); *G09G 2310/0251* (2013.01); *G09G 2310/0262* (2013.01); *G09G 2360/144* (2013.01)

(58) Field of Classification Search
CPC ... G09G 3/346; G09G 3/2003; G09G 3/2022; G02B 26/0841
See application file for complete search history.

(56) References Cited

U.S. PATENT DOCUMENTS

| | | | |
|---|---|---|---|
| 4,559,535 | A | 12/1985 | Watkins et al. |
| 4,564,836 | A | 1/1986 | Vuilleumier et al. |
| 5,061,049 | A | 10/1991 | Hornbeck |
| 5,062,689 | A | 11/1991 | Koehler |
| 5,093,652 | A | 3/1992 | Bull et al. |
| 5,096,279 | A | 3/1992 | Hornbeck et al. |
| 5,142,405 | A | 8/1992 | Hornbeck |
| 5,233,385 | A | 8/1993 | Sampsell |

(Continued)

FOREIGN PATENT DOCUMENTS

EP    1091342 A2    4/2001

OTHER PUBLICATIONS

Akimoto O. et al., "15.1: A 0.9-in UXGA/HDTV FLC Microdisplay," Society for Information Display, 2000, pp. 194-197.

(Continued)

*Primary Examiner* — Kumar Patel
*Assistant Examiner* — Mansour M Said
(74) *Attorney, Agent, or Firm* — Weaver Austin Villeneuve & Sampson LLP

(57) ABSTRACT

The invention relates to methods and apparatus for forming images on a display utilizing a control matrix to control the movement of MEMS-based light modulators.

21 Claims, 21 Drawing Sheets

(56) References Cited

U.S. PATENT DOCUMENTS

| | | |
|---|---|---|
| 5,233,459 A | 8/1993 | Bozler et al. |
| 5,278,652 A | 1/1994 | Urbanus et al. |
| 5,280,277 A | 1/1994 | Hornbeck |
| 5,319,491 A | 6/1994 | Selbrede |
| 5,339,116 A | 8/1994 | Urbanus et al. |
| 5,359,345 A | 10/1994 | Hunter |
| 5,452,024 A | 9/1995 | Sampsell |
| 5,461,411 A | 10/1995 | Florence et al. |
| 5,493,439 A | 2/1996 | Engle |
| 5,497,172 A | 3/1996 | Doherty et al. |
| 5,510,824 A | 4/1996 | Nelson |
| 5,517,347 A | 5/1996 | Sampsell |
| 5,523,803 A | 6/1996 | Urbanus et al. |
| 5,526,051 A | 6/1996 | Gove et al. |
| 5,548,301 A | 8/1996 | Kornher et al. |
| 5,724,062 A | 3/1998 | Hunter |
| 5,731,802 A | 3/1998 | Aras et al. |
| 5,745,193 A | 4/1998 | Urbanus et al. |
| 5,745,281 A | 4/1998 | Yi et al. |
| 5,771,321 A | 6/1998 | Stern |
| 5,781,331 A | 7/1998 | Carr et al. |
| 5,784,189 A | 7/1998 | Bozler et al. |
| 5,794,761 A | 8/1998 | Renaud et al. |
| 5,798,746 A | 8/1998 | Koyama |
| 5,835,256 A | 11/1998 | Huibers |
| 5,986,796 A | 11/1999 | Miles |
| 6,008,929 A | 12/1999 | Akimoto et al. |
| 6,034,807 A | 3/2000 | Little et al. |
| 6,046,840 A | 4/2000 | Huibers |
| 6,172,797 B1 | 1/2001 | Huibers |
| 6,201,633 B1 | 3/2001 | Peeters et al. |
| 6,225,991 B1 | 5/2001 | McKnight |
| 6,249,269 B1 | 6/2001 | Blalock et al. |
| 6,288,824 B1 | 9/2001 | Kastalsky |
| 6,300,154 B2 | 10/2001 | Clark et al. |
| 6,323,834 B1 | 11/2001 | Colgan et al. |
| 6,329,974 B1 | 12/2001 | Walker et al. |
| 6,388,661 B1 | 5/2002 | Richards |
| 6,424,329 B1 | 7/2002 | Okita |
| 6,567,063 B1 | 5/2003 | Okita |
| 6,600,474 B1 | 7/2003 | Heines et al. |
| 6,621,488 B1 | 9/2003 | Takeuchi et al. |
| 6,633,301 B1 | 10/2003 | Dallas et al. |
| 6,650,455 B2 | 11/2003 | Miles |
| 6,671,078 B2 | 12/2003 | Flanders et al. |
| 6,674,562 B1 | 1/2004 | Miles |
| 6,680,792 B2 | 1/2004 | Miles |
| 6,697,035 B2 | 2/2004 | Sugahara et al. |
| 6,701,039 B2 | 3/2004 | Bourgeois et al. |
| 6,762,743 B2 | 7/2004 | Yoshihara et al. |
| 6,775,048 B1 | 8/2004 | Starkweather et al. |
| 6,778,162 B2 | 8/2004 | Kimura et al. |
| 6,795,064 B2 | 9/2004 | Walker et al. |
| 6,798,935 B2 | 9/2004 | Bourgeois et al. |
| 6,844,959 B2 | 1/2005 | Huibers et al. |
| 6,873,311 B2 | 3/2005 | Yoshihara et al. |
| 6,879,307 B1 | 4/2005 | Stern |
| 6,900,072 B2 | 5/2005 | Patel et al. |
| 6,906,847 B2 | 6/2005 | Huibers et al. |
| 6,911,964 B2 | 6/2005 | Lee et al. |
| 6,963,330 B2 | 11/2005 | Sugahara et al. |
| 6,969,635 B2 | 11/2005 | Patel et al. |
| 6,980,349 B1 | 12/2005 | Huibers et al. |
| 7,042,618 B2 | 5/2006 | Selbrede et al. |
| 7,046,221 B1 | 5/2006 | Malzbender |
| 7,050,219 B2 | 5/2006 | Kimura |
| 7,057,790 B2 | 6/2006 | Selbrede |
| 7,092,142 B2 | 8/2006 | Selebrede et al. |
| 7,119,944 B2 | 10/2006 | Patel et al. |
| 7,123,796 B2 | 10/2006 | Steckl et al. |
| 7,198,982 B2 | 4/2007 | Patel et al. |
| 7,215,459 B2 | 5/2007 | Huibers et al. |
| 7,218,437 B2 | 5/2007 | Selbrede |
| 7,227,677 B2 | 6/2007 | Ravnkilde et al. |
| 7,274,416 B2 | 9/2007 | Feenstra et al. |
| 7,292,235 B2 | 11/2007 | Nose |
| 7,315,294 B2 | 1/2008 | Richards |
| 8,159,428 B2 | 4/2012 | Hagood et al. |
| 9,082,353 B2 | 7/2015 | Lewis et al. |
| 2001/0043167 A1* | 11/2001 | Sugahara ............. G09G 3/2011 345/31 |
| 2003/0231160 A1 | 12/2003 | Yoshihara et al. |
| 2004/0080484 A1 | 4/2004 | Heines et al. |
| 2004/0246275 A1 | 12/2004 | Yoshihara et al. |
| 2004/0263502 A1* | 12/2004 | Dallas ............... G02F 1/133553 345/204 |
| 2005/0062708 A1 | 3/2005 | Yoshihara et al. |
| 2005/0073471 A1 | 4/2005 | Selbrede |
| 2005/0088404 A1 | 4/2005 | Heines et al. |
| 2005/0122560 A1 | 6/2005 | Sampsell et al. |
| 2005/0168431 A1 | 8/2005 | Chui |
| 2005/0172625 A1 | 8/2005 | Starkweather et al. |
| 2005/0206991 A1 | 9/2005 | Chui et al. |
| 2005/0212734 A1 | 9/2005 | Kimura |
| 2006/0044246 A1 | 3/2006 | Mignard |
| 2006/0044928 A1 | 3/2006 | Chui et al. |
| 2006/0061559 A1 | 3/2006 | King |
| 2006/0066504 A1 | 3/2006 | Sampsell et al. |
| 2006/0066560 A1* | 3/2006 | Gally .................. G02B 26/001 345/108 |
| 2006/0066937 A1 | 3/2006 | Chui |
| 2006/0238443 A1 | 10/2006 | Derichs |
| 2006/0291774 A1 | 12/2006 | Schoellmann et al. |
| 2007/0047051 A1 | 3/2007 | Selbrede et al. |
| 2007/0047887 A1 | 3/2007 | Selbrede |
| 2007/0103209 A1 | 5/2007 | Lee |
| 2007/0172171 A1 | 7/2007 | Van Ostrand et al. |
| 2009/0091561 A1* | 4/2009 | Koyama ................ G09G 3/344 345/211 |
| 2009/0103281 A1 | 4/2009 | Koh |
| 2009/0128585 A1* | 5/2009 | Shimodaira ............ G09G 3/344 345/690 |
| 2010/0328608 A1* | 12/2010 | Fujii ...................... G02B 21/06 351/211 |

OTHER PUBLICATIONS

Alt P.M., et al., "A Gray-Scale Addressing Technique for Thin-Film-Transistor/Liquid Crystal Displays," IBM J. Res. Develop., 36 (1), Jan. 1992, pp. 11-22.

Boer W.D., "Active Matrix Liquid Crystal Displays", Elsevier Science & Technology Books, ISBN #0750678135, Aug. 2005, Publisher's annotation in 2 pages.

Chino E. et al., "25.1: Invited Paper: Development of Wide-Color-Gamut Mobile Displays with Four-primary-color LCDs," Society for Information Display, 37 (2), 2006, pp. 1221-1224.

Clark N. A., et al., "FLC Microdisplays", Ferroelectrics, 246, 2000, pp. 97-110.

Doherty D. et al., "Pulse Width Modulation Control of DLP Projectors", TI Technical Journal, Jul.-Sep. 1998, No. 3, pp. 115-121.

Feenstra J. et al., "Electrowetting Displays", Liquavista BV, http://www.liquavista.com/documents/electrowetting_displays_whitepaper.pdf, Retrieved on Aug. 17, 2006, pp. 1-16.

Hornbeck J. "Digital Light Processing TM: A New MEMS-Based Display Technology," Technical Digest of the IEEJ 14th Sensor Symposium, Jun. 4-5, 1996, pp. 297-304.

Kunzman A. et al., "10.3 White Enhancement for Color Sequential DLP", Society for Information Display, Digest of Technical Papers, 1998.

Markandey V. et al., "Video Processing for DLP Display Systems," Texas Instruments Corporation, Mar. 13, 1996, pp. 21-32.

Ravnkilde J., et al., "Fabrication of Nickel Microshutter Arrays for Spatial Light Modulation", Mesomechanics, 2002, pp. 161-165. Also on their web site: http://www2.mic.dtu.dk/research/mems/publications/Papers/Dicon_Meso2002.pdf.

Takatori, et al., "6.3: Field-Sequential Smectic LCD with TFT Pixel Amplifier," SID 01, 2001, Digest, pp. 48-51.

Wang K., et al., "Highly Space-Efficient Electrostatic Zigzag Transmissive Micro-Optic Switches for an Integrated MEMS Optical Display System", Transducers 03 Conference, Jun. 8-12, 2003, vol. 1, pp. 575-575.

* cited by examiner

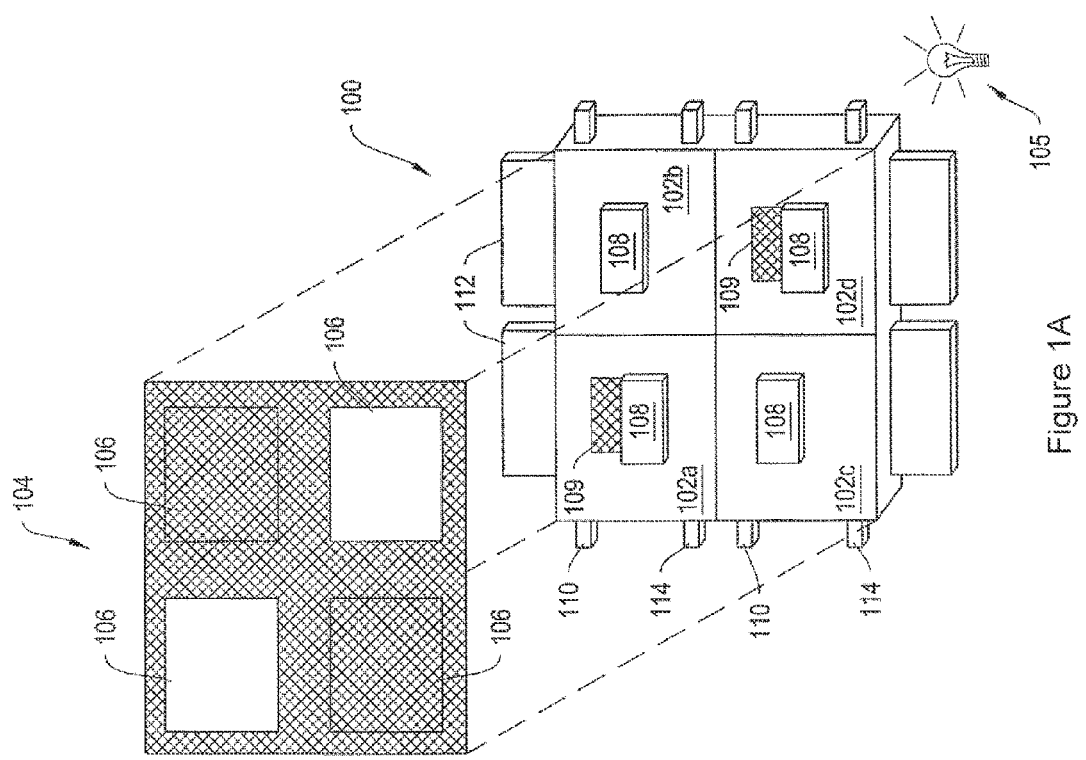

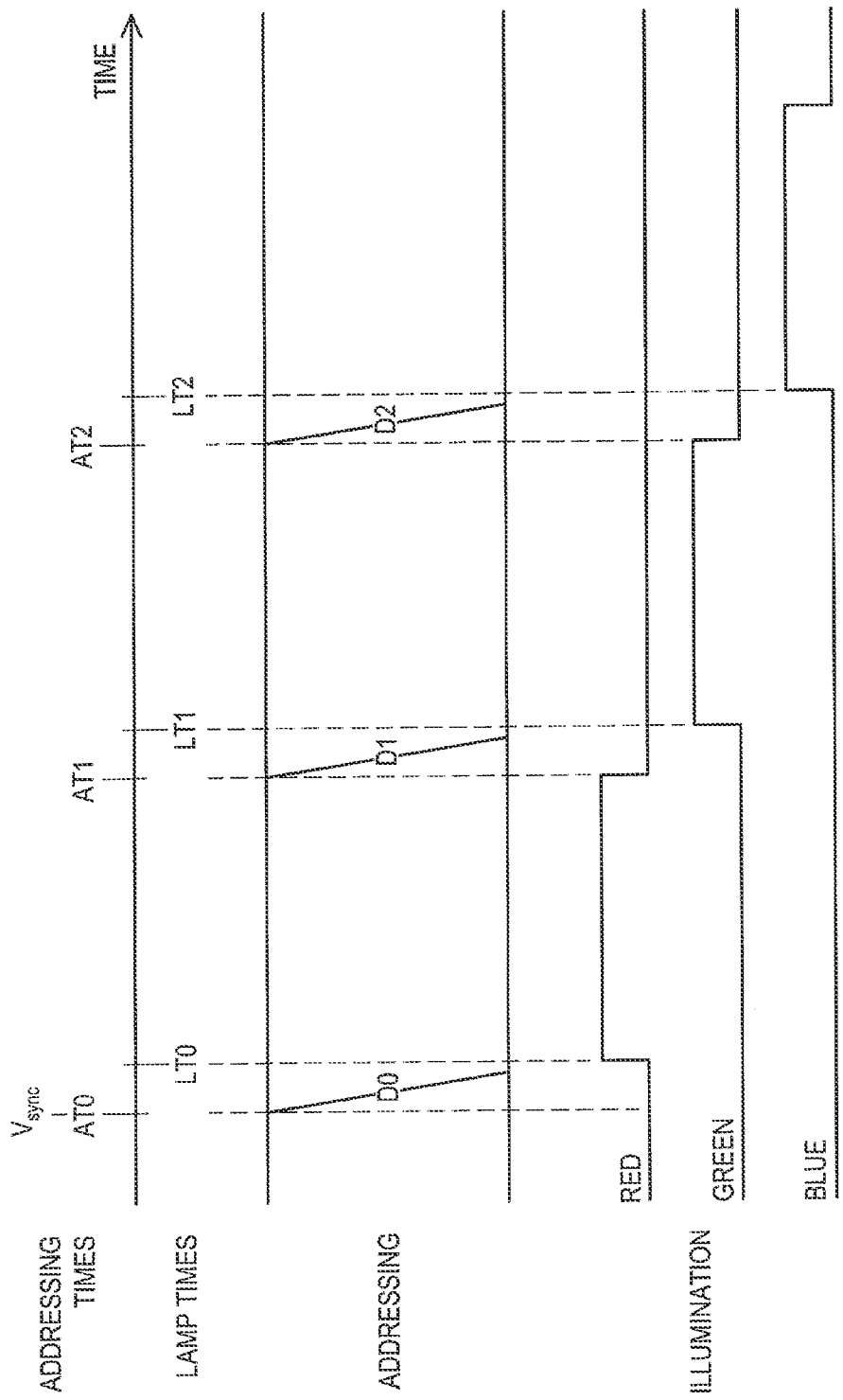

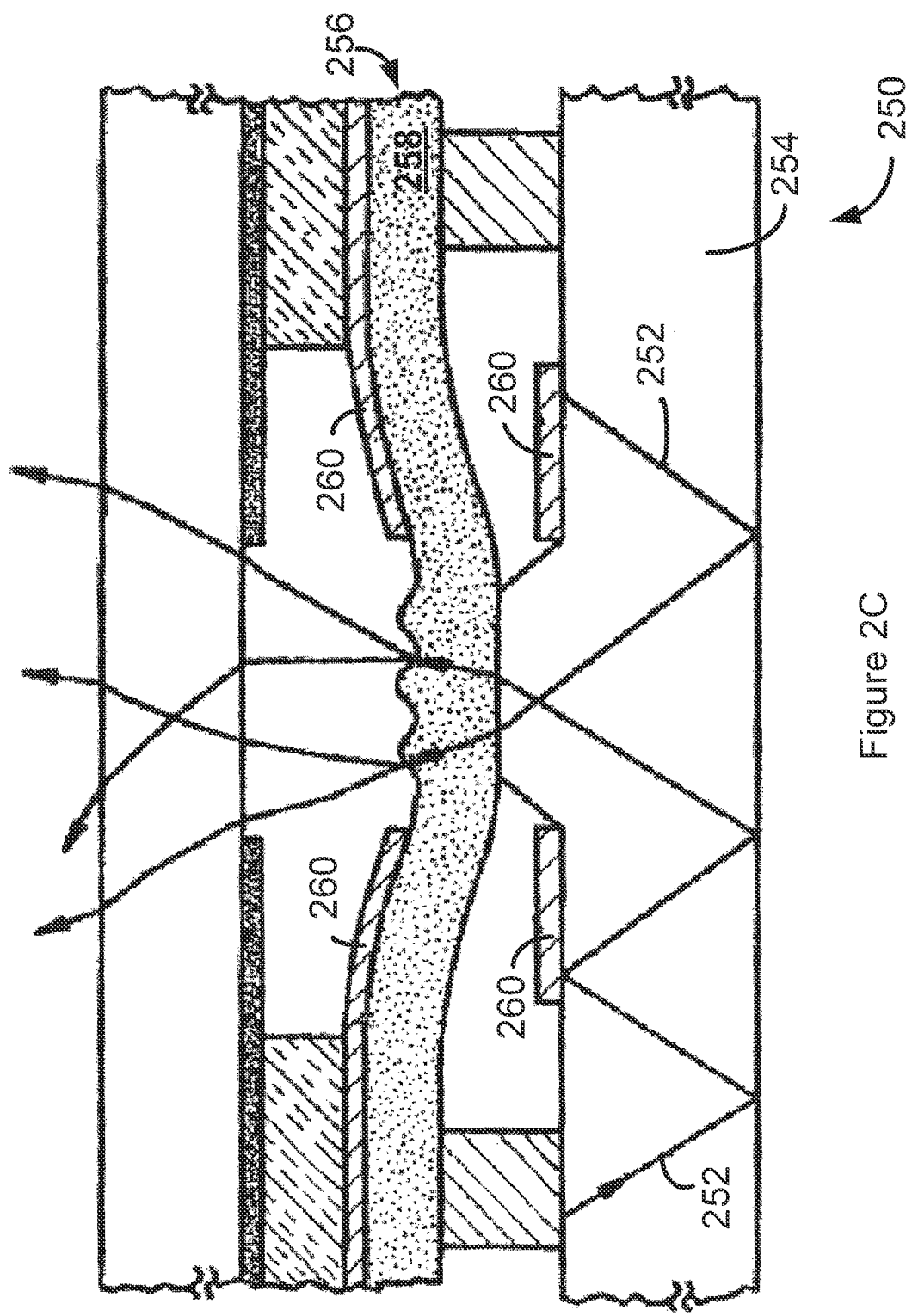

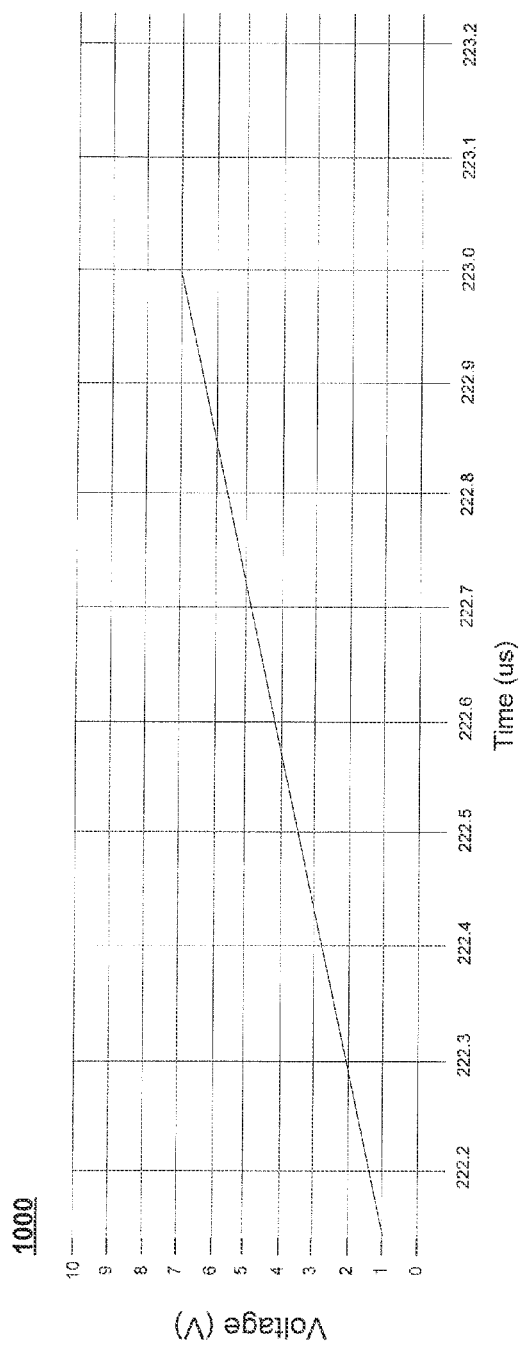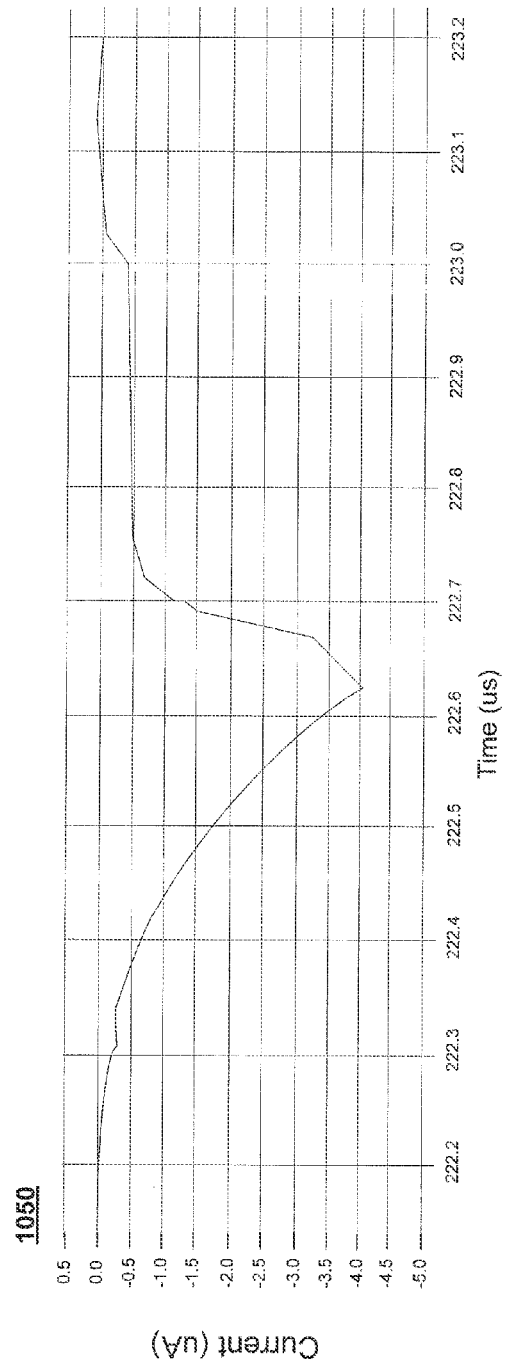
Figure 10A
Figure 10B

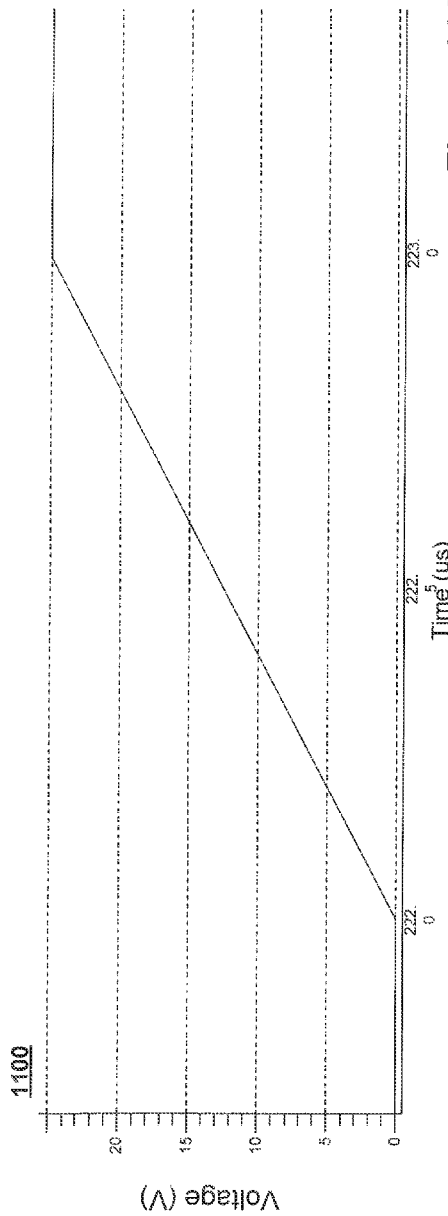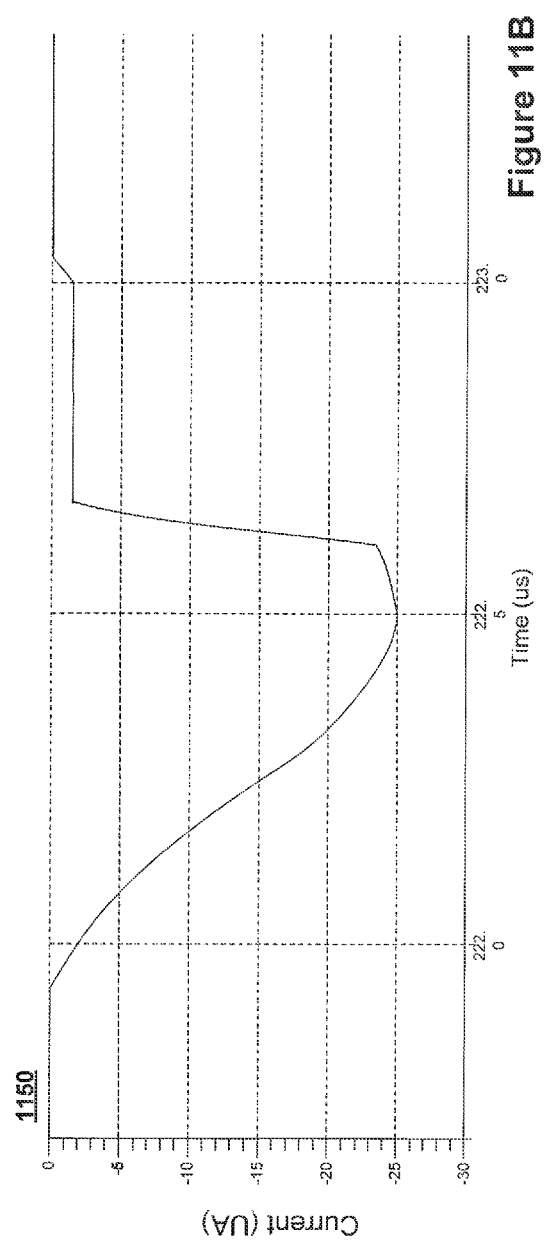

CIRCUITS FOR CONTROLLING DISPLAY APPARATUS

PRIORITY DATA

This application claims priority to U.S. patent application Ser. No. 12/652,477, titled "Circuits for Controlling Display Apparatus", by Lewis et al., filed on Jan. 5, 2010, which is hereby incorporated by reference in its entirety and for all purposes.

FIELD OF THE INVENTION

In general, the invention relates to the field of imaging displays, in particular, the invention relates to controller circuits and processes for controlling light modulators incorporated into imaging displays.

BACKGROUND OF THE INVENTION

Displays built from mechanical light modulators are an attractive alternative to displays based on liquid crystal technology. Mechanical light modulators are fast enough to display video content with good viewing angles and with a wide range of color and grey scale. Mechanical light modulators have been successful in projection display applications. Direct-view displays using mechanical light modulators have not yet demonstrated sufficiently attractive combinations of brightness and low power. There is a need in the art for fast, bright, low-powered mechanically actuated direct-view displays. Specifically there is a need for direct-view displays that can be driven at high speeds and at low voltages for improved image quality and reduced power consumption.

In contrast to projection displays in which switching circuitry and light modulators can be built on relatively small die cut from silicon substrates, most direct-view displays require the fabrication of light modulators on much larger substrates. In addition, in many cases, particularly for backlit direct view displays, both the control circuitry and the light modulators are preferably formed on transparent substrates. As a result, many typical semiconductor manufacturing processes are inapplicable. New switching circuits and control algorithms often need to be developed to address the fundamental differences in materials, process technology, and performance characteristics of MEMS devices built on transparent substrates. A need remains for MEMS direct-view displays that incorporate modulation processes in conjunction with switching circuitry that yield detailed images along with rich levels of grayscale and contrast.

SUMMARY

The invention relates to direct-view display apparatuses including an array of pixels. The array of pixels include, for each pixel, a MEMS-based light modulator formed on a substrate, and a first actuator and a second actuator opposing the first actuator for controlling the state of the light modulator to form an image on the display apparatus. In certain embodiments, the array of pixels include a control matrix disposed on the substrate which includes a dual inverter latch coupling the first and second actuators and configured to maintain an opposite logical state on the first and second actuators. In some embodiments, the substrate is a transparent substrate.

In one aspect of the invention, the dual inverter latch includes two cross-coupled inverters. In some embodiments, the two cross-coupled inverters may include two transistors, dual gate transistors, may be connected to a cascode circuit, or any combination thereof.

In some embodiments, the display apparatus includes a data store in which the dual inverter latch is latched in the first state based, at least in part, on a data voltage stored in the data store. In certain embodiments, the display apparatus includes a switch coupling the data store to the dual inverter latch for allowing the data to pass from the data store to the dual inverter latch. In one aspect, the switch is controlled by a common voltage interconnect for a plurality of rows and columns. In certain embodiments, the switch functions to electrically de-couple the data store from the dual inverter latch to prevent current from flowing between the data store and the dual inverter latch.

In some embodiments, the display apparatus includes an actuation line interconnect. In one aspect, the actuation line interconnect is configured to provide a voltage to only one of the first and second actuators for actuating the light modulator to form an image. In some embodiments, the actuation line interconnect provides an intermediate voltage to latch the dual inverter latch in a first state corresponding to the data voltage.

In certain embodiments, the invention relates to a method for addressing pixels in a display in which each pixel includes a MEMS based light modulator, first and second actuators, and a dual inverter latch coupling the first and second actuators for maintaining an opposite logical state on the first and second actuators. The method includes loading data into a data store coupled to the dual inverter latch, updating the latch state based at least in part on the loaded data such that a full actuation voltage is only applied to one of the first and second actuators, and actuating the MEMS based light modulator. In one aspect, actuating the MEMS-based light modulator includes applying voltages to the MEMS-based light modulator and to the first and second actuators in accordance with a polarity reversal process.

BRIEF DESCRIPTION OF THE DRAWINGS

The foregoing discussion will be understood more readily from the following detailed description of the invention with reference to the following drawings:

FIG. 1A is an isometric view of display apparatus, according to an illustrative embodiment of the invention;

FIG. 1C is a timing diagram for a method of displaying an image on a display using a field sequential color technique, according to an illustrative embodiment of the invention;

FIG. 2C is a cross sectional view of a light-tap-based light modulator suitable for incorporation into an alternative embodiment of the MEMS-based display of FIG. 1A, according to an illustrative embodiment of the invention;

FIG. 10A is a chart of the voltage increase on an actuator node during pixel operation, according to an illustrative embodiment of the invention;

FIG. 10B is a chart of the latch current transient of the coupled transistors during pixel operation, according to an illustrative embodiment of the invention;

FIG. 11A is a chart of the voltage increase on an actuator node during pixel operation, according to an illustrative embodiment of the invention;

FIG. 11B is a chart of the latch current transient of the coupled transistors during pixel operation, according to an illustrative embodiment of the invention;

DESCRIPTION OF CERTAIN ILLUSTRATIVE EMBODIMENTS

Figure 1B:
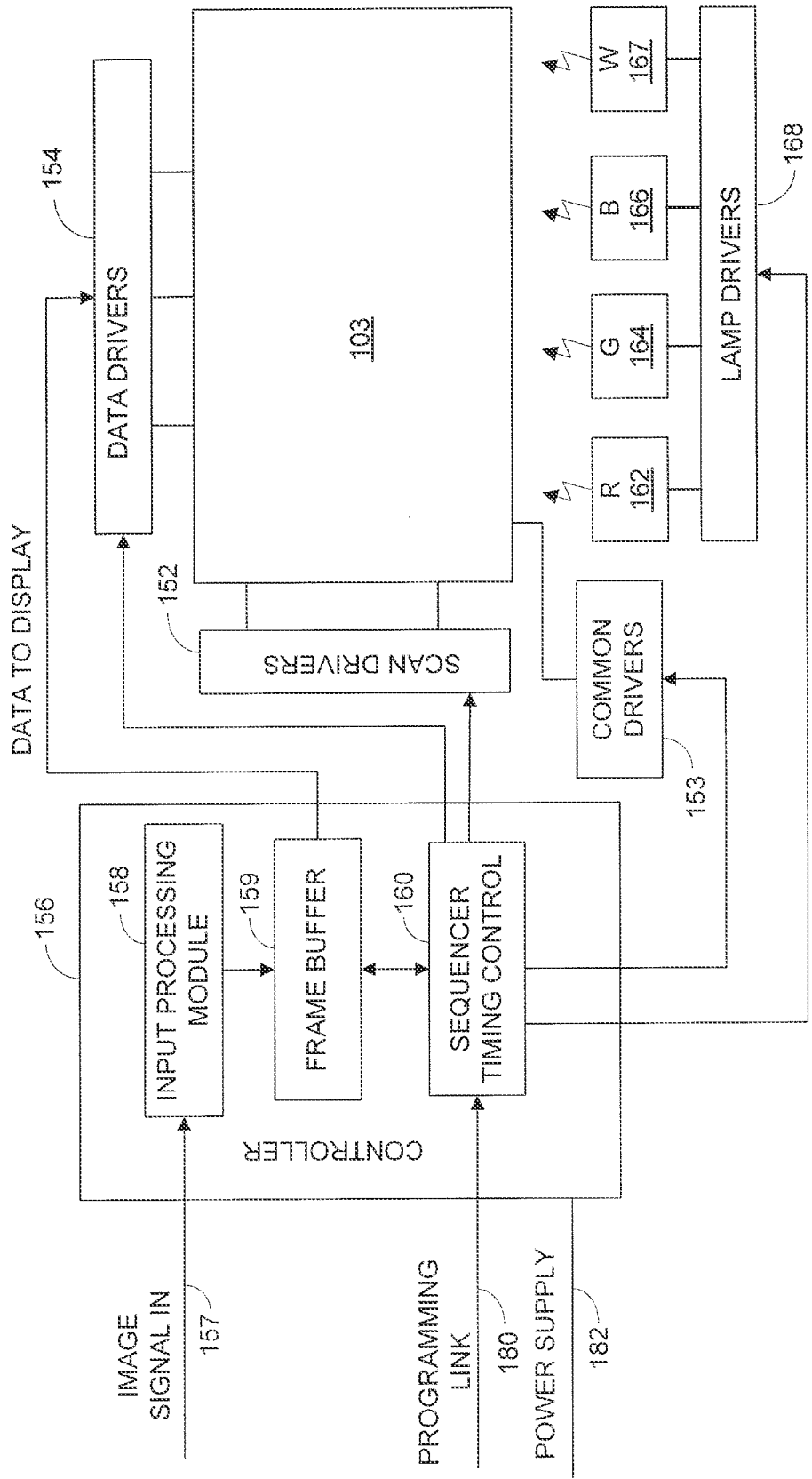
FIG. 1B is a block diagram of the display apparatus of FIG. 1A, according to an illustrative embodiment of the invention.

To provide an overall understanding of the invention, certain illustrative embodiments will now be described, including apparatus and methods for displaying images. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

FIG. 1A is a schematic diagram of a direct-view MEMS-based display apparatus 100, according to an illustrative embodiment of the invention. The display apparatus 100 includes a plurality of light modulators 102a-102d (generally "light modulators 102") arranged in rows and columns. In the display apparatus 100, light modulators 102a and 102d are in the open state, allowing light to pass. Light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e. by use of a frontlight. In one of the closed or open states, the light modulators 102 interfere with light in an optical path by, for example, and without limitation, blocking, reflecting, absorbing, filtering, polarizing, diffracting, or otherwise altering a property or path of the light.

In the display apparatus 100, each light modulator 102 corresponds to a pixel 106 in the image 104. In other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide grayscale in an image 104. With respect to an image, a "pixel" corresponds to the smallest picture element defined by the resolution of the image. With respect to structural components of the display apparatus 100, the term "pixel" refers to the combined mechanical and electrical components utilized to modulate the light that forms a single pixel of the image.

Display apparatus 100 is a direct-view display in that it does not require imaging optics. The user sees an image by looking directly at the display apparatus 100. In alternate embodiments the display apparatus 100 is incorporated into a projection display. In such embodiments, the display forms an image by projecting light onto a screen or onto a wall. In projection applications the display apparatus 100 is substantially smaller than the projected image 104.

Direct-view displays may operate in either a transmissive or reflective mode. In a transmissive display, the light modulators filter or selectively block light which originates from a lamp or lamps positioned behind the display. The light from the lamps is optionally injected into a light guide or "backlight". Transmissive direct-view display embodiments are often built onto transparent or glass substrates to facilitate a sandwich assembly arrangement where one substrate, containing the light modulators, is positioned directly on top of the backlight. In some transmissive display embodiments, a color-specific light modulator is created by associating a color filter material with each modulator 102. In other transmissive display embodiments colors can be generated, as described below, using a field sequential color method by alternating illumination of lamps with different primary colors.

Each light modulator 102 includes a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material.

The display apparatus also includes a control matrix connected to the substrate and to the light modulators for controlling the movement of the shutters. The control matrix includes a series of electrical interconnects (e.g., interconnects 110, 112, and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, $V_{we}$"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In other implementations, the data voltage pulses control switches, e.g., transistors or other nonlinear circuit elements that control the application of separate actuation voltages, which are typically higher in magnitude than the data voltages, to the light modulators 102. The application of these actuation voltages then results in the electrostatic driven movement of the shutters 108.

FIG. 1B is a block diagram 150 of the display apparatus 100. Referring to FIGS. 1A and 1B, in addition to the elements of the display apparatus 100 described above, as depicted in the block diagram 150, the display apparatus 100 includes a plurality of scan drivers 152 (also referred to as "write enabling voltage sources") and a plurality of data drivers 154 (also referred to as "data voltage sources"). The scan drivers 152 apply write enabling voltages to scan-line interconnects 110. The data drivers 154 apply data voltages to the data interconnects 112. In some embodiments of the display apparatus, the data drivers 154 are configured to provide analog data voltages to the light modulators, especially where the gray scale of the image 104 is to be derived in analog fashion. In analog operation the light modulators 102 are designed such that when a range of intermediate voltages is applied through the data interconnects 112 there results a range of intermediate open states in the shutters 108 and therefore a range of intermediate illumination states or gray scales in the image 104.

In other cases the data drivers 154 are configured to apply only a reduced set of 2, 3, or 4 digital voltage levels to the control matrix. These voltage levels are designed to set, in digital fashion, either an open state or a closed state to each of the shutters 108.

The scan drivers 152 and the data drivers 154 are connected to digital controller circuit 156 (also referred to as the "controller 156"). The controller 156 includes an input processing module 158, which processes an incoming image signal 157 into a digital image format appropriate to the spatial addressing and the gray scale capabilities of the display 100. The pixel location and gray scale data of each image is stored in a frame buffer 159 so that the data can be fed out as needed to the data drivers 154. The data is sent to the data drivers 154 in mostly serial fashion, organized in predetermined sequences grouped by rows and by image frames. The data drivers 154 can include series to parallel data converters, level shifting, and for some applications digital to analog voltage converters.

The display 100 apparatus optionally includes a set of common drivers 153, also referred to as common voltage sources. In some embodiments the common drivers 153 provide a DC common potential to all light modulators within the array of light modulators 103, for instance by supplying voltage to a series of common interconnects 114. In other embodiments the common drivers 153, following commands from the controller 156, issue voltage pulses or signals to the array of light modulators 103, for instance global actuation pulses which are capable of driving and/or initiating simultaneous actuation of all light modulators in multiple rows and columns of the array 103.

All of the drivers (e.g., scan drivers 152, data drivers 154, and common drivers 153) for different display functions are time-synchronized by a timing-control module 160 in the controller 156. Timing commands from the module 160 coordinate the illumination of red, green and blue and white lamps (162, 164, 166, and 167 respectively) via lamp drivers 168, the write-enabling and sequencing of specific rows within the array of pixels 103, the output of voltages from the data drivers 154, and the output of voltages that provide for light modulator actuation.

The controller 156 determines the sequencing or addressing scheme by which each of the shutters 108 in the array 103 can be re-set to the illumination levels appropriate to a new image 104. Details of suitable addressing, image formation, and gray scale techniques can be found in U.S. patent application Ser. Nos. 11/326,696 and 11/643,042, incorporated herein by reference. New images 104 can be set at periodic intervals. For instance, for video displays, the color images 104 or frames of video are refreshed at frequencies ranging from 10 to 300 Hertz. In some embodiments the setting of an image frame to the array 103 is synchronized with the illumination of the lamps 162, 164, and 166 such that alternate image frames are illuminated with an alternating series of colors, such as red, green, and blue. The image frames for each respective color is referred to as a color sub-frame. In this method, referred to as the field sequential color method, if the color sub-frames are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 156 determines the addressing sequence and/or the time intervals between image frames to produce images 104 with appropriate gray scale. The process of generating varying levels of grayscale by controlling the amount of time a shutter 108 is open in a particular frame is referred to as time division gray scale. In one embodiment of time division gray scale, the controller 156 determines the time period or the fraction of time within each frame that a shutter 108 is allowed to remain in the open state, according to the illumination level or gray scale desired of that pixel. In other implementations, for each image frame, the controller 156 sets a plurality of sub-frame images in multiple rows and columns of the array 103, and the controller alters the duration over which each sub-frame image is illuminated in proportion to a gray scale value or significance value employed within a coded word for gray scale. For instance, the illumination times for a series of sub-frame images can be varied in proportion to the binary coding series 1,2,4,8 . . . . The shutters 108 for each pixel in the array 103 are then set to either the open or closed state within a sub-frame image according to the value at a corresponding position within the pixel's binary coded word for gray level.

In other implementations, the controller alters the intensity of light from the lamps 162, 164, and 166 in proportion to the gray scale value desired for a particular sub-frame image. A number of hybrid techniques are also available for forming colors and gray scale from an array of shutters 108. For instance, the time division techniques described above can be combined with the use of multiple shutters 108 per pixel, or the gray scale value for a particular sub-frame image can be established through a combination of both sub-frame timing and lamp intensity. Details of these and other embodiments can be found in U.S. patent application Ser. No. 11/643,042, referenced above.

In some implementations the data for an image state 104 is loaded by the controller 156 to the modulator array 103 by a sequential addressing of individual rows, also referred to as scan lines. For each row or scan line in the sequence, the scan driver 152 applies a write-enable voltage to the write enable interconnect 110 for that row of the array 103, and subsequently the data driver 154 supplies data voltages, corresponding to desired shutter states, for each column in the selected row. This process repeats until data has been loaded for all rows in the array. In some implementations the sequence of selected rows for data loading is linear, proceeding from top to bottom in the array. In other implementations the sequence of selected rows is pseudo-randomized, in order to minimize visual artifacts. And in other implementations the sequencing is organized by blocks, where, for a block, the data for only a certain fraction of the image state 104 is loaded to the array, for instance by addressing only every $5^{th}$ row of the array in sequence.

In some implementations, the process for loading image data to the array 103 is separated in time from the process of actuating the shutters 108. In these implementations, the modulator array 103 may include data memory elements for each pixel in the array 103 and the control matrix may include a global actuation interconnect for carrying trigger signals, from common driver 153, to initiate simultaneous actuation of shutters 108 according to data stored in the memory elements. Various addressing sequences, many of which are described in U.S. patent application Ser. No. 11/643,042, can be coordinated by means of the timing control module 160.

In alternative embodiments, the array of pixels 103 and the control matrix that controls the pixels may be arranged in configurations other than rectangular rows and columns. For example, the pixels can be arranged in hexagonal arrays or curvilinear rows and columns. In general, as used herein, the term scan-line shall refer to any plurality of pixels that share a write-enabling interconnect.

The display 100 is comprised of a plurality of functional blocks including the timing control module 160, the frame buffer 159, scan drivers 152, data drivers 154, and drivers 153 and 168. Each block can be understood to represent either a distinguishable hardware circuit and/or a module of executable code. In some implementations the functional blocks are provided as distinct chips or circuits connected together by means of circuit boards and/or cables. Alternately, many of these circuits can be fabricated along with the pixel array 103 on the same substrate of glass or plastic. In other implementations, multiple circuits, drivers, processors, and/or control functions from block diagram 150 may be integrated together within a single silicon chip, which is then bonded directly to the transparent substrate holding pixel array 103.

The controller 156 includes a programming link 180 by which the addressing, color, and/or gray scale algorithms, which are implemented within controller 156, can be altered according to the needs of particular applications. In some embodiments, the programming link 180 conveys information from environmental sensors, such as ambient light or temperature sensors, so that the controller 156 can adjust imaging modes or backlight power in correspondence with environmental conditions. The controller 156 also comprises a power supply input 182 which provides the power needed for lamps as well as light modulator actuation. Where necessary, the drivers 152 153, 154, and/or 168 may include or be associated with DC-DC converters for transforming an input voltage at 182 into various voltages sufficient for the actuation of shutters 108 or illumination of the lamps, such as lamps 162, 164, 166, and 167.

Field Sequential Color/Time Division Grayscale

The human brain, in response to viewing rapidly changing images, for example, at frequencies of greater than 20 Hz, averages images together to perceive an image which is the combination of the images displayed within a corresponding period. This phenomenon can be utilized to display color images while using only single light modulators for each pixel of a display, using a technique referred to in the art as field sequential color. The use of field sequential color techniques in displays eliminates the need for color filters and multiple light modulators per pixel. In a field sequential color enabled display, an image frame to be displayed is divided into a number of sub-frame images, each corresponding to a particular color component (for example, red, green, or blue) of the original image frame. For each sub-frame image, the light modulators of a display are set into states corresponding to the color component's contribution to the image. The light modulators then are illuminated by a lamp of the corresponding color. The sub-images are displayed in sequence at a frequency (for example, greater than 60 Hz) sufficient for the brain to perceive the series of sub-frame images as a single image. The data used to generate the sub-frames are often fractured in various memory components. For example, in some displays, data for a given row of display are kept in a shift-register dedicated to that row. Image data is shifted in and out of each shift register to a light modulator in a corresponding column in that row of the display according to a fixed clock cycle.

FIG. 1C is a timing diagram corresponding to a display process for displaying images using field sequential color, which can be implemented according to an illustrative embodiment of the invention, for example, by a MEMS direct-view display described in FIG. 1B. The timing diagrams included herein, including the timing diagram of FIG. 1C, conform to the following conventions. The top portions of the timing diagrams illustrate light modulator addressing events. The bottom portions illustrate lamp illumination events.

The addressing portions depict addressing events by diagonal lines spaced apart in time. Each diagonal line corresponds to a series of individual data loading events during which data is loaded into each row of an array of light modulators, one row at a time. Depending on the control matrix used to address and drive the modulators included in the display, each loading event may require a waiting period to allow the light modulators in a given row to actuate. In some implementations, all rows in the array of light modulators are addressed prior to actuation of any of the light modulators. Upon completion of loading data into the last row of the array of light modulators, all light modulators are actuated substantially simultaneously.

Lamp illumination events are illustrated by pulse trains corresponding to each color of lamp included in the display. Each pulse indicates that the lamp of the corresponding color is illuminated, thereby displaying the sub-frame image loaded into the array of light modulators in the immediately preceding addressing event.

The time at which the first addressing event in the display of a given image frame begins is labeled on each timing diagram as AT0. In most of the timing diagrams, this time falls shortly after the detection of a voltage pulse vsync, which precedes the beginning of each video frame received by a display. The times at which each subsequent addressing event takes place are labeled as AT1, AT2, . . . AT(n−1), where n is the number of sub-frame images used to display the image frame. In some of the timing diagrams, the diagonal lines are further labeled to indicate the data being loaded into the array of light modulators. For example, in the timing diagram of FIG. 1C, D0 represents the first data loaded into the array of light modulators for a frame and D(n−1) represents the last data loaded into the array of light modulators for the frame. In the timing diagrams of FIG. 1D, the data loaded during each addressing event corresponds to a bitplane.

Figure 1D:
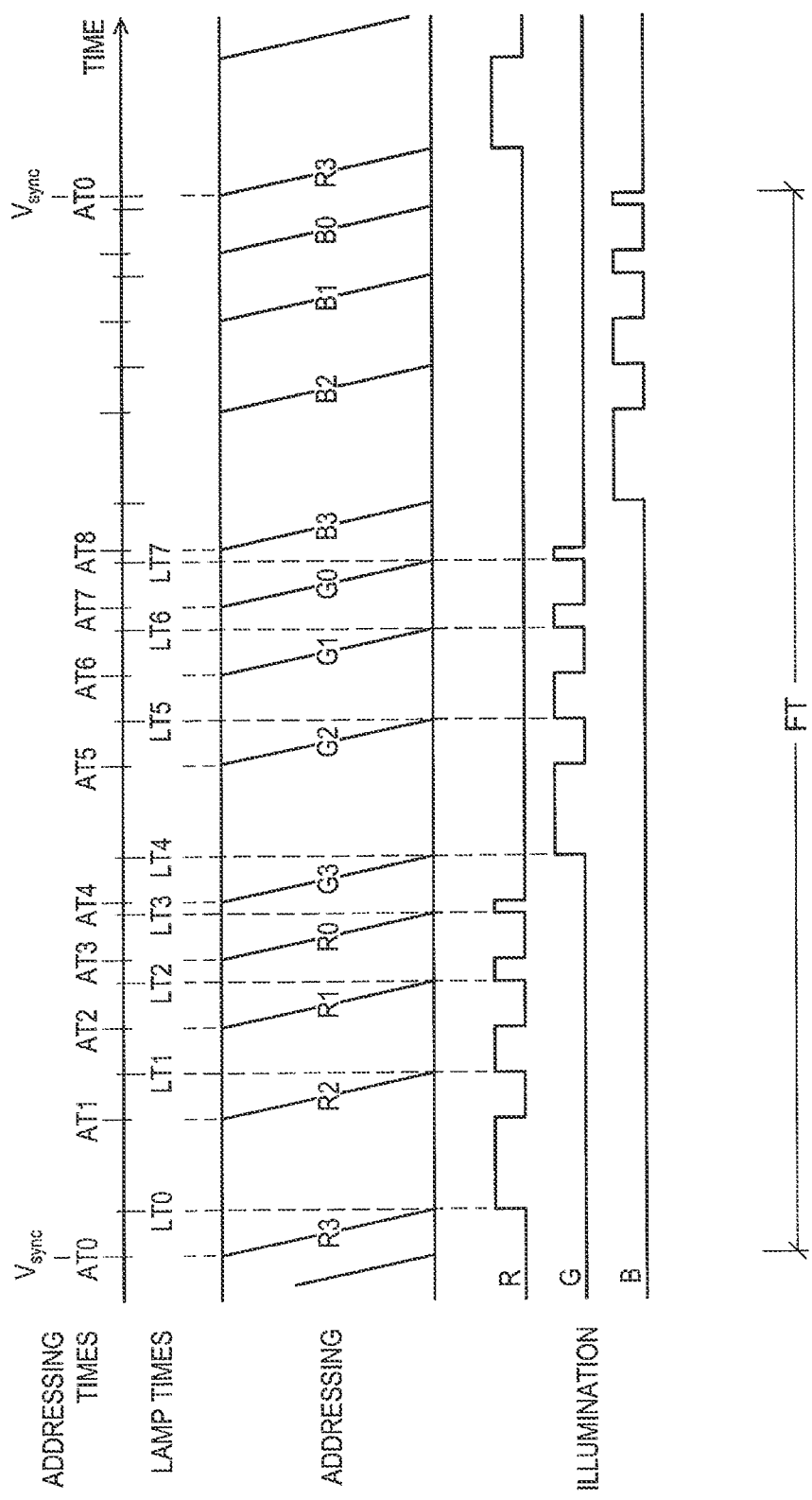
FIG. 1D is a timing diagram illustrating the timing of various image formation events using a coded time division grayscale technique, according to an illustrative embodiment of the invention.

FIG. 1D is a timing diagram that corresponds to a coded-time division grayscale display process in which image frames are displayed by displaying four sub-frame images for each of three color components (red, green, and blue) of the image frame. Each sub-frame image displayed of a given color is displayed at the same intensity for half as long a time period as the prior sub-frame image, thereby implementing a binary weighting scheme for the sub-frame images.

The display of an image frame begins upon the detection of a vsync pulse. The first sub-frame data set R3, stored beginning at memory location M0, is loaded into the array of light modulators 103 in an addressing event that begins at time AT0. The red lamp is then illuminated at time LT0. LT0 is selected such that it occurs after each of the rows in the array of light modulators 103 has been addressed, and the light modulators included therein have actuated. At time AT1, the controller 156 of the direct-view display both extinguishes the red lamp and begins loading the subsequent bitplane, R2, into the array of light modulators 103. This bitplane is stored beginning at memory location M1. The process repeats until all bitplanes have been displayed. For example, at time AT4, the controller 156 extinguishes the red lamp and begins loading the most significant green bitplane, G3, into the array of light modulators 103. Similarly at time LT6, the controller 156 turns on the green lamp until time AT7, at which it time it is extinguished again.

The time period between vsync pulses in the timing diagram is indicated by the symbol FT, indicating a frame time. In some implementations the addressing times AT0, AT1, etc. as well as the lamp times LT0, LT1, etc. are designed to accomplish 4 sub-frame images per color within a frame time FT of 16.6 milliseconds, i.e. according to a frame rate of 60 Hz. In other implementations the time values can be altered to accomplish 4 sub-frame images per color within a frame time FT of 33.3 milliseconds, i.e. according to a frame rate of 30 Hz. In other implementations frame rates as low as 24 Hz may be employed or frame rates in excess of 100 Hz may be employed.

In the particular implementation of coded time division gray scale illustrated by the timing diagram in FIG. 1D, the controller outputs 4 sub-frame images to the array 103 of light modulators for each color to be displayed. The illumination of each of the 4 sub-frame images is weighted according to the binary series 1,2,4,8. The display process in the timing diagram of FIG. 1D, therefore, displays a 4-digit binary word for gray scale in each color, that is, it is capable of displaying 16 distinct gray scale levels for each color, despite the loading of only 4 sub-images per color. Through combinations of the colors, the implementation of the timing diagram of FIG. 1D is capable of displaying more than 4000 distinct colors.

MEMS Light Modulators

Figure 2A:
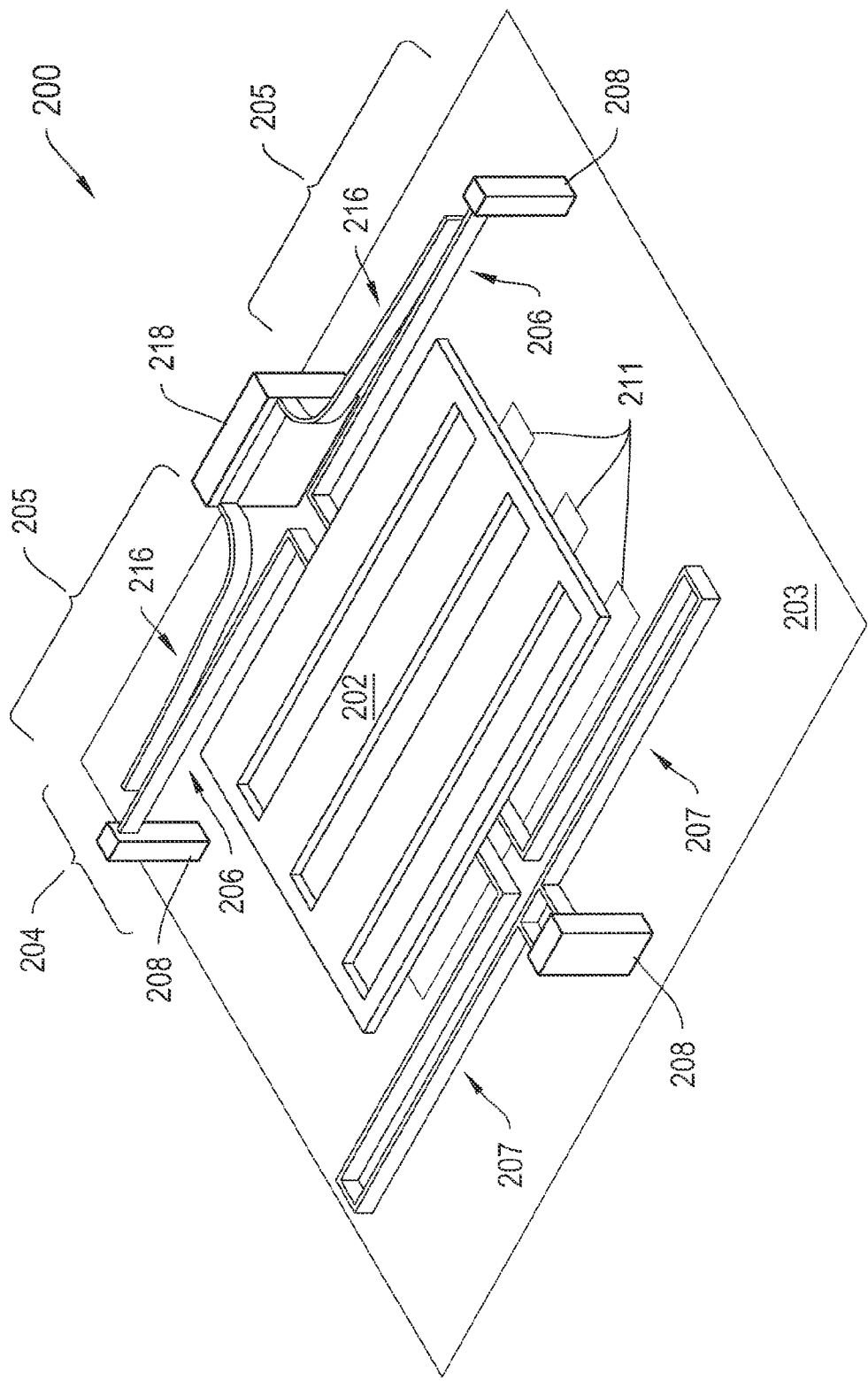
FIG. 2A is a perspective view of an illustrative shutter-based light modulator suitable for incorporation into the MEMS-based display of FIG. 1A, according to an illustrative embodiment of the invention.

FIG. 2A is a perspective view of an illustrative shutter-based light modulator 200 suitable for incorporation into the MEMS-based display apparatus 100 of FIG. 1A, according to an illustrative embodiment of the invention. The shutter-based light modulator 200 (also referred to as shutter assembly 200) includes a shutter 202 coupled to an actuator 204. The actuator 204 is formed from two separate compliant electrode beam actuators 205 (the "actuators 205"), as described in U.S. Pat. No. 7,271,945, filed on Sep. 18, 2007. The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The load anchors 208 physically connect the compliant load beams 206 and the shutter 202 to the surface 203 and electrically connect the load beams 206 to a bias voltage, in some instances, ground.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

The surface 203 includes one or more apertures 211 for admitting the passage of light. If the shutter assembly 200 is formed on an opaque substrate, made, for example, from silicon, then the surface 203 is a surface of the substrate, and the apertures 211 are formed by etching an array of holes through the substrate. If the shutter assembly 200 is formed on a transparent substrate, made, for example, of glass or plastic, then the surface 203 is a surface of a light blocking layer deposited on the substrate, and the apertures are formed by etching the surface 203 into an array of holes 211. The apertures 211 can be generally circular, elliptical, polygonal, serpentine, or irregular in shape.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely towards the drive anchor 218. The compliant members 206 act as springs, such that when the voltage across the beams 206 and 216 is removed, the load beams 206 push the shutter 202 back into its initial position, releasing the stress stored in the load beams 206.

The shutter assembly 200, also referred to as an elastic shutter assembly, incorporates a passive restoring force, such as a spring, for returning a shutter to its rest or relaxed position after voltages have been removed. A number of elastic restore mechanisms and various electrostatic couplings can be designed into or in conjunction with electrostatic actuators, the compliant beams illustrated in shutter assembly 200 being just one example. Other examples are described in U.S. Pat. No. 7,271,945 and U.S. patent application Ser. No. 11/326,696, incorporated herein by reference. For instance, a highly non-linear voltage-displacement response can be provided which favors an abrupt transition between "open" vs "closed" states of operation, and which, in many cases, provides a bi-stable or hysteretic operating characteristic for the shutter assembly. Other electrostatic actuators can be designed with more incremental voltage-displacement responses and with considerably reduced hysteresis, as may be preferred for analog gray scale operation.

The actuator 205 within the elastic shutter assembly is said to operate between a closed or actuated position and a relaxed position. The designer, however, can choose to place apertures 211 such that shutter assembly 200 is in either the "open" state, i.e. passing light, or in the "closed" state, i.e. blocking light, whenever actuator 205 is in its relaxed position. For illustrative purposes, it is assumed below that elastic shutter assemblies described herein are designed to be open in their relaxed state.

In many cases it is preferable to provide a dual set of "open" and "closed" actuators as part of a shutter assembly so that the control electronics are capable of electrostatically driving the shutters into each of the open and closed states.

Figure 2B:
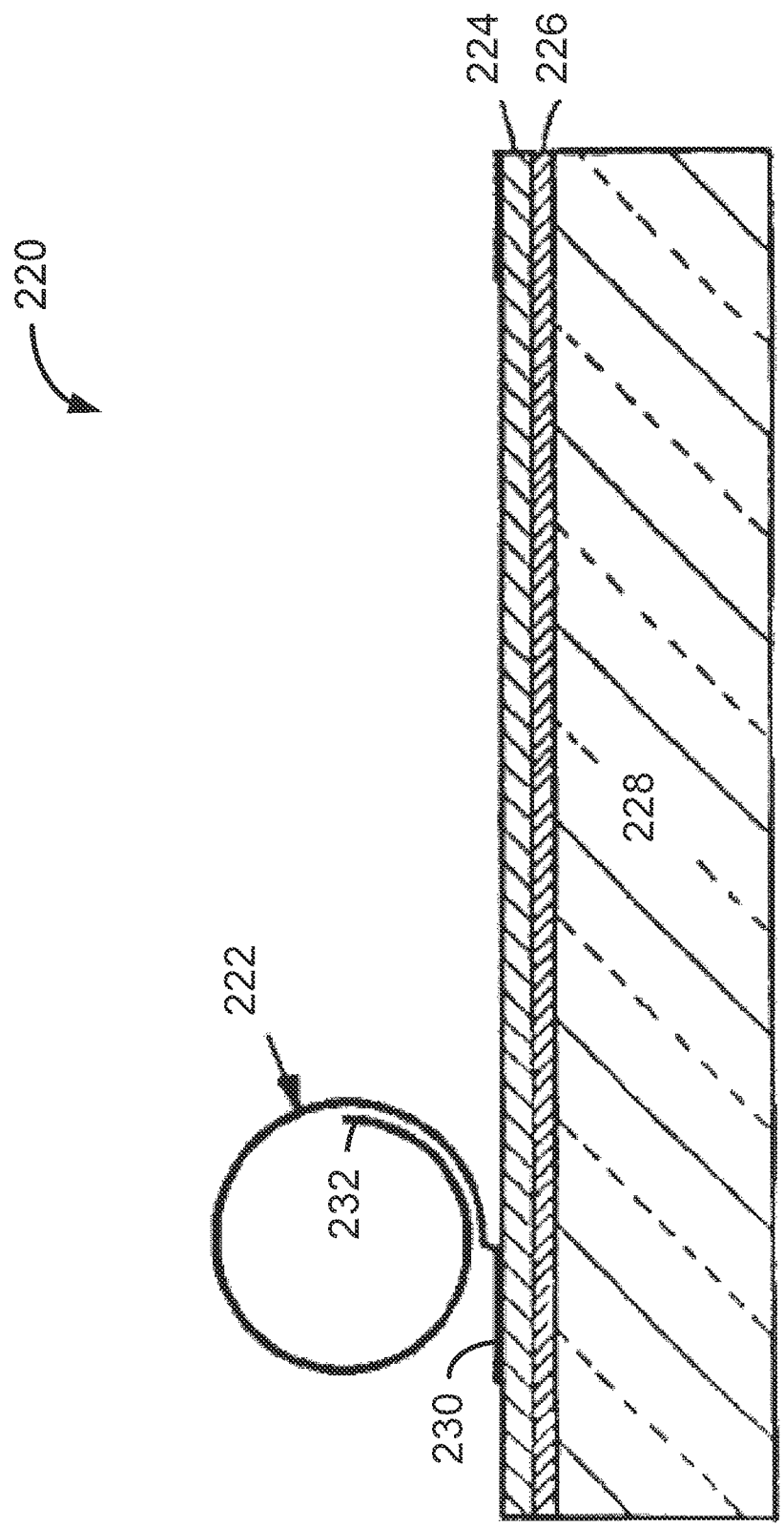
FIG. 2B is a cross-sectional view of a rollershade-based light modulator suitable for incorporation into the MEMS-based display of FIG. 1A, according to an illustrative embodiment of the invention.

Display apparatus 100, in alternative embodiments, includes light modulators other than transverse shutter-based light modulators, such as the shutter assembly 200 described above. For example, FIG. 2B is a cross-sectional view of a rolling actuator shutter-based light modulator 220 suitable for incorporation into an alternative embodiment of the MEMS-based display apparatus 100 of FIG. 1A, according to an illustrative embodiment of the invention. As described further in U.S. Pat. No. 5,233,459, entitled "Electric Display Device," and U.S. Pat. No. 5,784,189, entitled "Spatial Light Modulator," the entireties of which are incorporated herein by reference, a rolling actuator-based light modulator includes a moveable electrode disposed opposite a fixed electrode and biased to move in a preferred direction to produce a shutter upon application of an electric field. In one embodiment, the light modulator 220 includes a planar electrode 226 disposed between a substrate 228 and an insulating layer 224 and a moveable electrode 222 having a fixed end 230 attached to the insulating layer 224. In the absence of any applied voltage, a moveable end 232 of the moveable electrode 222 is free to roll towards the fixed end 230 to produce a rolled state. Application of a voltage between the electrodes 222 and 226 causes the moveable electrode 222 to unroll and lie flat against the insulating layer 224, whereby it acts as a shutter that blocks light traveling through the substrate 228. The moveable electrode 222 returns to the rolled state by means of an elastic restoring force after the voltage is removed. The bias towards a rolled state may be achieved by manufacturing the moveable electrode 222 to include an anisotropic stress state.

FIG. 2C is a cross-sectional view of an illustrative non shutter-based MEMS light modulator 250. The light tap modulator 250 is suitable for incorporation into an alternative embodiment of the MEMS-based display apparatus 100 of FIG. 1A, according to an illustrative embodiment of the invention. As described further in U.S. Pat. No. 5,771,321, entitled "Micromechanical Optical Switch and Flat Panel Display," the entirety of which is incorporated herein by reference, a light tap works according to a principle of frustrated total internal reflection. That is, light 252 is introduced into a light guide 254, in which, without interference, light 252 is for the most part unable to escape the light guide 254 through its front or rear surfaces due to total internal reflection. The light tap 250 includes a tap element 256 that has a sufficiently high index of refraction that, in response to the tap element 256 contacting the light guide 254, light 252 impinging on the surface of the light guide 254 adjacent the tap element 256 escapes the light guide 254 through the tap element 256 towards a viewer, thereby contributing to the formation of an image.

In one embodiment, the tap element 256 is formed as part of beam 258 of flexible, transparent material. Electrodes 260 coat portions of one side of the beam 258. Opposing electrodes 260 are disposed on the light guide 254. By applying a voltage across the electrodes 260, the position of the tap element 256 relative to the light guide 254 can be controlled to selectively extract light 252 from the light guide 254.

Figure 2D:
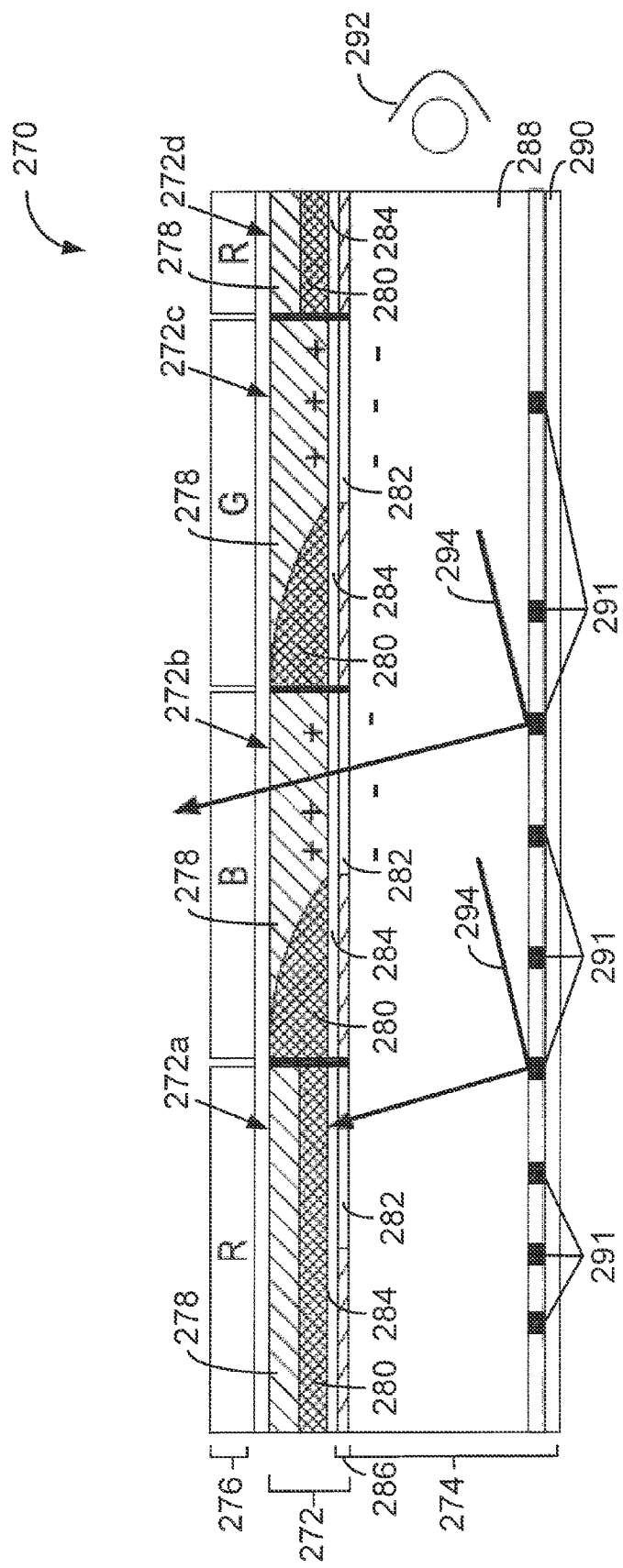
FIG. 2D is a cross sectional view of an electrowetting-based light modulator suitable for incorporation into an alternative embodiment of the MEMS-based display of FIG. 1A, according to an illustrative embodiment of the invention.

FIG. 2D is a cross sectional view of a second illustrative non-shutter-based MEMS light modulator suitable for inclusion in various embodiments of the invention. Specifically, FIG. 2D is a cross sectional view of an electrowetting-based light modulation array 270. The electrowetting-based light modulator array 270 is suitable for incorporation into an alternative embodiment of the MEMS-based display apparatus 100 of FIG. 1A, according to an illustrative embodiment of the invention. The light modulation array 270 includes a plurality of electrowetting-based light modulation cells 272a-272d (generally "cells 272") formed on an optical cavity 274. The light modulation array 270 also includes a set of color filters 276 corresponding to the cells 272.

Each cell 272 includes a layer of water (or other transparent conductive or polar fluid) 278, a layer of light absorbing oil 280, a transparent electrode 282 (made, for example, from indium-tin oxide) and an insulating layer 284 positioned between the layer of light absorbing oil 280 and the transparent electrode 282. Illustrative implementations of such cells are described further in U.S. Patent Application Publication No. 2005/0104804, published May 19, 2005 and entitled "Display Device." In the embodiment described herein, the electrode takes up a portion of a rear surface of a cell 272.

The light modulation array 270 also includes a light guide 288 and one or more light sources 292 which inject light 294 into the light guide 288. A series of light redirectors 291 are formed on the rear surface of the light guide, proximate a front facing reflective layer 290. The light redirectors 291 may be either diffuse or specular reflectors. The modulation array 270 includes an aperture layer 286 which is patterned into a series of apertures, one aperture for each of the cells 272, to allow light rays 294 to pass through the cells 272 and toward the viewer.

In one embodiment the aperture layer 286 is comprised of a light absorbing material to block the passage of light except through the patterned apertures. In another embodiment the aperture layer 286 is comprised of a reflective material which reflects light not passing through the surface apertures back towards the rear of the light guide 288. After returning to the light guide, the reflected light can be further recycled by the front facing reflective layer 290.

In operation, application of a voltage to the electrode 282 of a cell causes the light absorbing oil 280 in the cell to move into or collect in one portion of the cell 272. As a result, the light absorbing oil 280 no longer obstructs the passage of light through the aperture formed in the reflective aperture layer 286 (see, for example, cells 272b and 272c). Light escaping the light guide 288 at the aperture is then able to escape through the cell and through a corresponding color (for example, red, green, or blue) filter in the set of color filters 276 to form a color pixel in an image. When the electrode 282 is grounded, the light absorbing oil 280 returns to its previous position (as in cell 272a) and covers the aperture in the reflective aperture layer 286, absorbing any light 294 attempting to pass through it.

The roller-based light modulator 220, light tap 250, and electrowetting-based light modulation array 270 are not the only examples of MEMS light modulators suitable for inclusion in various embodiments of the invention. It will be understood that other MEMS light modulators can exist and can be usefully incorporated into the invention.

U.S. Pat. No. 7,271,945 and U.S. patent application Ser. No. 11/326,696 have described a variety of methods by which an array of shutters can be controlled via a control matrix to produce images, in many cases moving images, with appropriate gray scale. In some cases, control is accomplished by means of a passive matrix array of row and column interconnects connected to driver circuits on the periphery of the display. In other cases it is appropriate to include switching and/or data storage elements within each pixel of the array (the so-called active matrix) to improve either the speed, the gray scale and/or the power dissipation performance of the display.

Figure 3A:
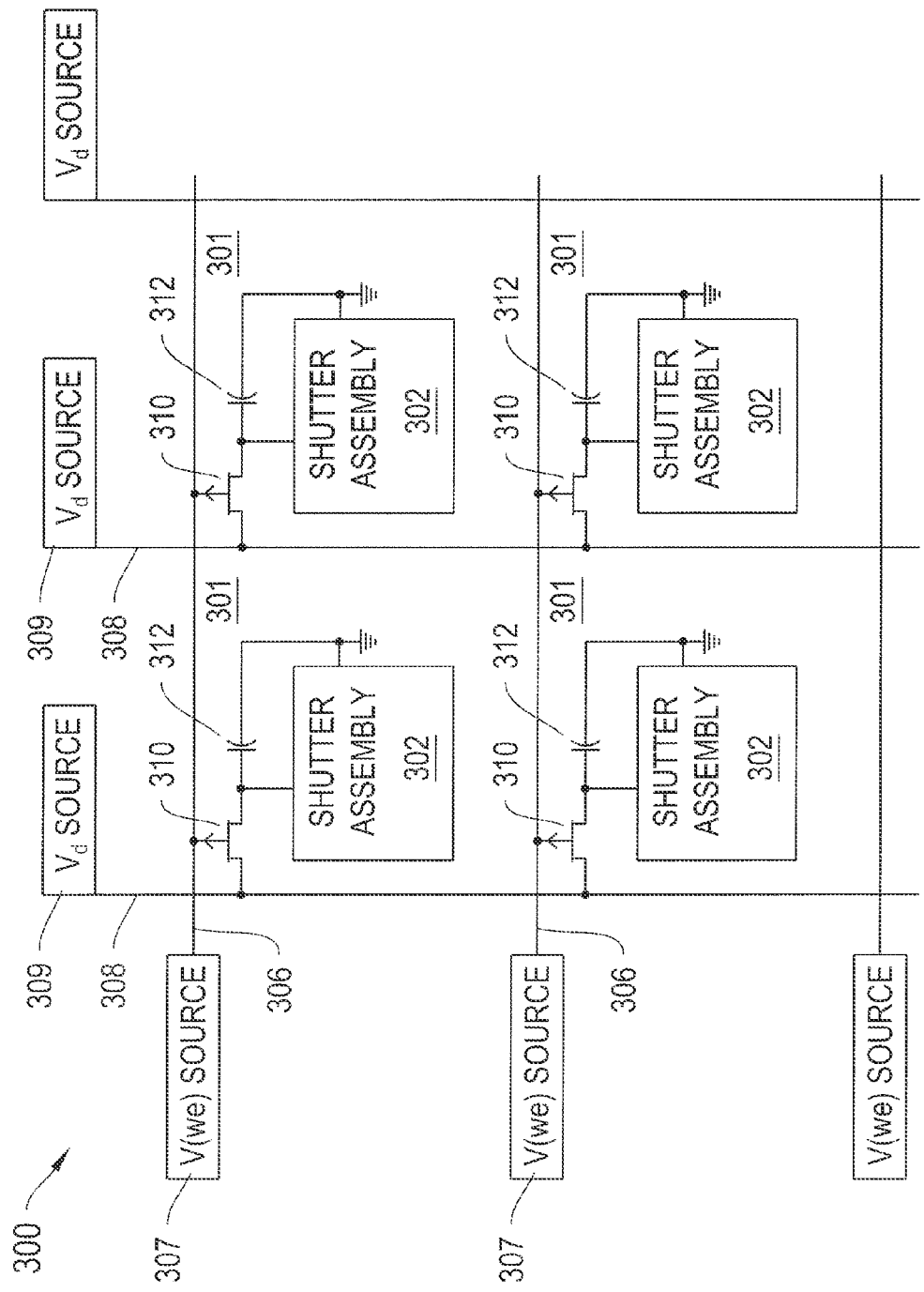
FIG. 3A is a schematic diagram of a control matrix suitable for controlling the light modulators incorporated into the MEMS-based display of FIG. 1A, according to an illustrative embodiment of the invention.
Figure 3B:
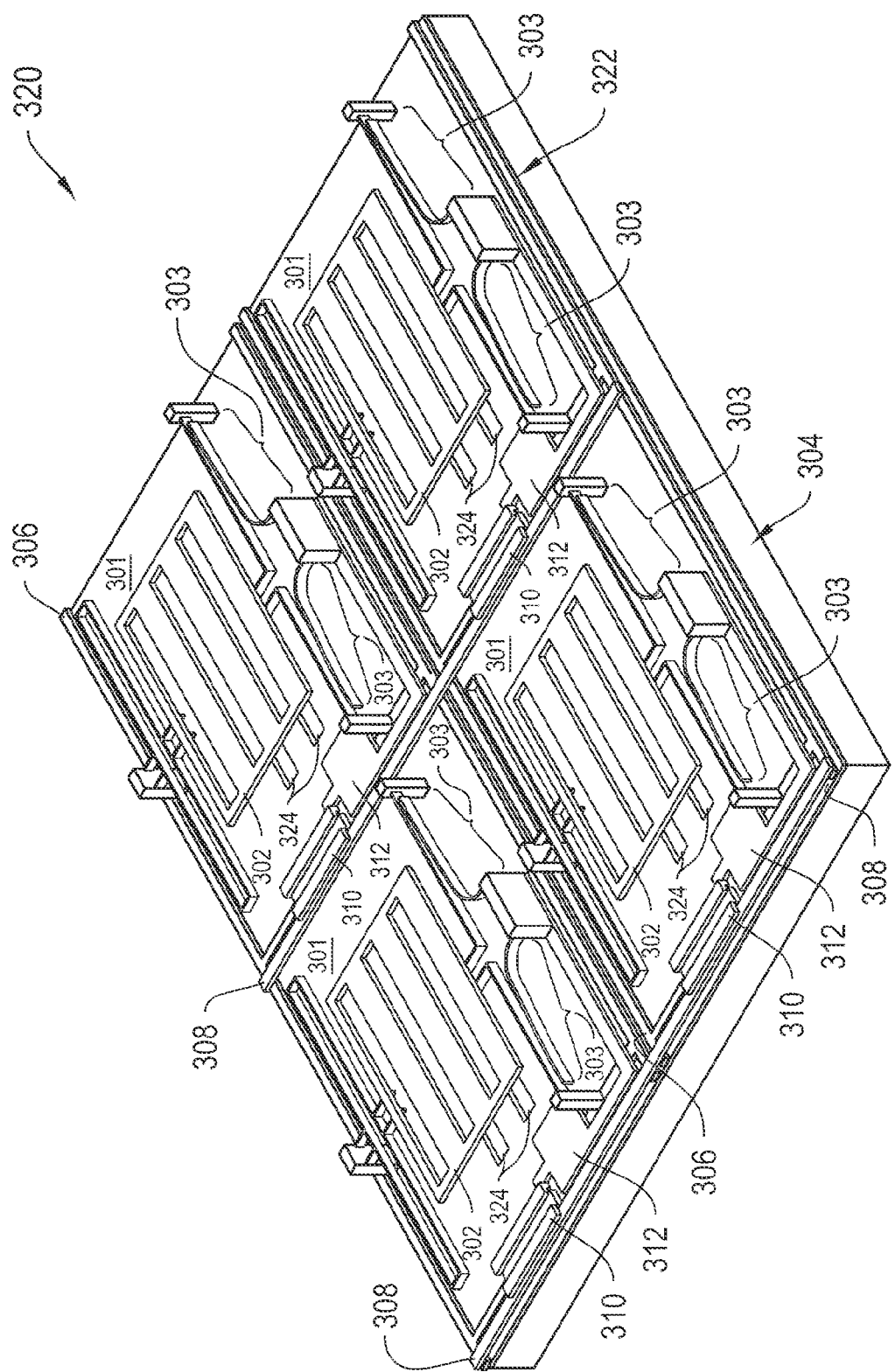
FIG. 3B is a perspective view of an array of shutter-based light modulators connected to the control matrix of FIG. 3A, according to an illustrative embodiment of the invention.

FIG. 3A is a schematic diagram of a control matrix 300 suitable for controlling the light modulators incorporated into the MEMS-based display apparatus 100 of FIG. 1A, according to an illustrative embodiment of the invention. FIG. 3B is a perspective view of an array 320 of shutter-based light modulators connected to the control matrix 300 of FIG. 3A, according to an illustrative embodiment of the invention. The control matrix 300 may address an array of pixels 320 (the "array 320"). Each pixel 301 includes an elastic shutter assembly 302, such as the shutter assembly 200 of FIG. 2A, controlled by an actuator 303. Each pixel also includes an aperture layer 322 that includes apertures 324. Further electrical and mechanical descriptions of shutter assemblies such as shutter assembly 302, and variations thereon, can be found in U.S. Pat. No. 7,271,945 and U.S. patent application Ser. No. 11/326,696. Descriptions of alternate control matrices can also be found in U.S. patent application Ser. No. 11/607, 715.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source, ("Vd source") 309 to the pixels 301 in a corresponding column of pixels 301. In control matrix 300, the data voltage $V_d$ provides the majority of the energy necessary for actuation of the shutter assemblies 302. Thus, the data voltage source 309 also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying $V_{we}$ to each scan-line interconnect 306 in turn. For a write-enabled row, the application of $V_{we}$ to the gates of the transistors 310 of the pixels 301 in the row allows the flow of current through the data interconnects 308 through the transistors 310 to apply a potential to the actuator 303 of the shutter assembly 302. While the row is write-enabled, data voltages $V_d$ are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed $V_{at}$ (the actuation threshold voltage). In response to the application of $V_{at}$ to a data interconnect 308, the actuator 303 in the corresponding shutter assembly 302 actuates, opening the shutter in that shutter assembly 302. The voltage applied to the data interconnect 308 remains stored in the capacitor 312 of the pixel 301 even after the control matrix 300 ceases to apply $V_{we}$ to a row. It is not necessary, therefore, to wait and hold the voltage $V_{we}$ on a row for times long enough for the shutter assembly 302 to actuate; such actuation can proceed after the write-enabling voltage has been removed from the row. The capacitors 312 also function as memory elements within the array 320, storing actuation instructions for periods as long as is necessary for the illumination of an image frame.

The pixels 301 as well as the control matrix 300 of the array 320 are formed on a substrate 304. The array includes an aperture layer 322, disposed on the substrate 304, which includes a set of apertures 324 for respective pixels 301 in the array 320. The apertures 324 are aligned with the shutter assemblies 302 in each pixel. In one implementation the substrate 304 is made of a transparent material, such as glass or plastic. In another implementation the substrate 304 is made of an opaque material, but in which holes are etched to form the apertures 324.

Components of shutter assemblies 302 are processed either at the same time as the control matrix 300 or in subsequent processing steps on the same substrate. The electrical components in control matrix 300 are fabricated using many thin film techniques in common with the manufacture of thin film transistor arrays for liquid crystal displays. Available techniques are described in Den Boer, *Active Matrix Liquid Crystal Displays* (Elsevier, Amsterdam, 2005), incorporated herein by reference. The shutter assemblies are fabricated using techniques similar to the art of micromachining or from the manufacture of micromechanical (i.e., MEMS) devices. Many applicable thin film MEMS techniques are described in Rai-Choudhury, ed., Handbook of Microlithography, Micromachining & Microfabrication (SPIE Optical Engineering Press, Bellingham, Wash. 1997), incorporated herein by reference. Fabrication techniques specific to MEMS light modulators formed on glass substrates can be found in U.S. patent application Ser. Nos. 11/361,785 and 11/731,628, incorporated herein by reference. For instance, as described in those applications, the shutter assembly 302 can be formed from thin films of amorphous silicon, deposited by a chemical vapor deposition process.

The shutter assembly 302 together with the actuator 303 can be made bi-stable. That is, the shutters can exist in at least two equilibrium positions (e.g. open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 can also be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as spring 207 in shutter-based light modulator 200, or the opposing force may be exerted by an opposing actuator, such as an "open" or "closed" actuator.

The light modulator array 320 is depicted as having a single MEMS light modulator per pixel. Other embodiments are possible in which multiple MEMS light modulators are provided in each pixel, thereby providing the possibility of more than just binary "on' or "off" optical states in each pixel. Certain forms of coded area division gray scale are possible where multiple MEMS light modulators in the pixel are provided, and where apertures 324, which are associated with each of the light modulators, have unequal areas.

In other embodiments, the roller-based light modulator 220, the light tap 250, or the electrowetting-based light modulation array 270, as well as other MEMS-based light modulators, can be substituted for the shutter assembly 302 within the light modulator array 320.

Figure 4A:
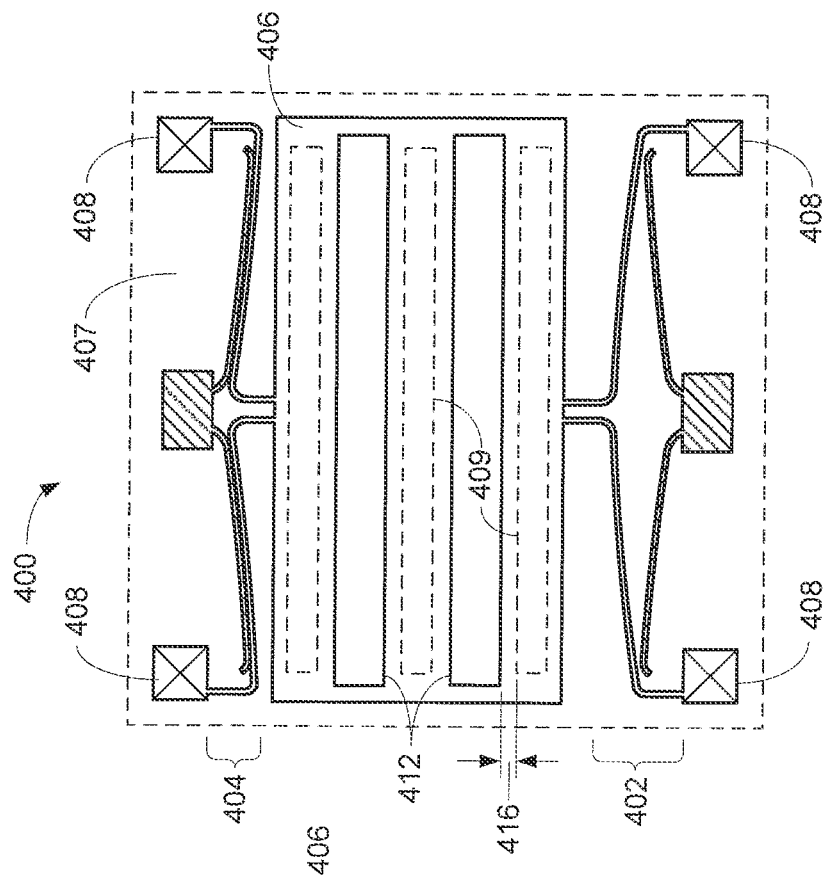
FIGS. 4A and 4B are plan views of a dual-actuated shutter assembly in the open and closed states respectively, according to an illustrative embodiment of the invention.
Figure 4B:
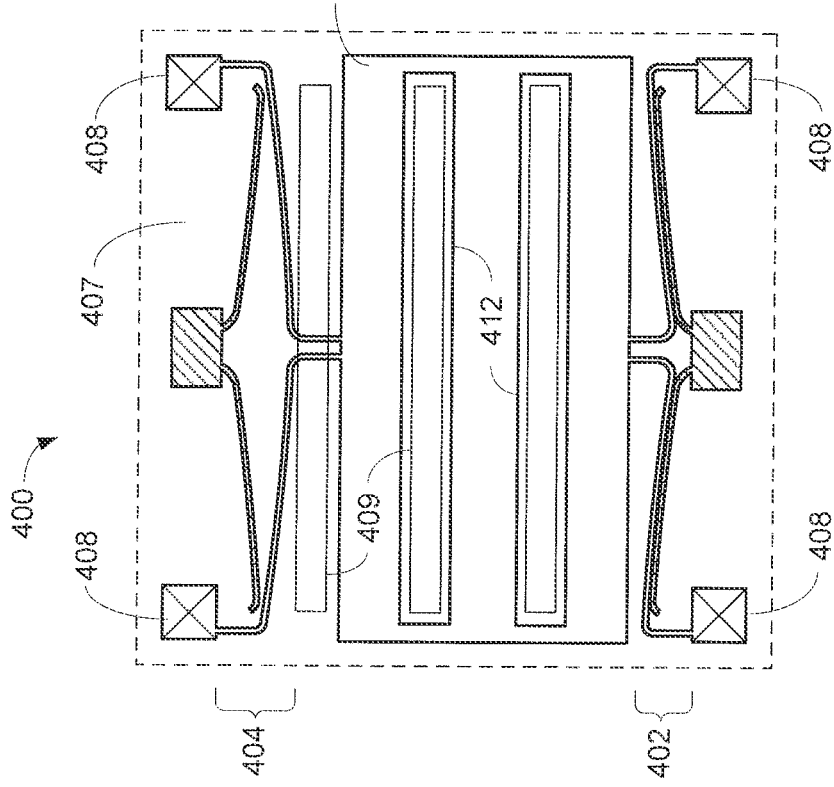

FIGS. 4A and 4B illustrate an alternative shutter-based light modulator (shutter assembly) 400 suitable for inclusion in various embodiments of the invention. The light modulator 400 is an example of a dual actuator shutter assembly, and is shown in FIG. 4A in an open state. FIG. 4B is a view of the dual actuator shutter assembly 400 in a closed state. Shutter assembly 400 is described in further detail in U.S. patent application Ser. No. 11/251,035, referenced above. In contrast to the shutter assembly 200, shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially a plane parallel to the substrate. By analogy to the control matrix 300 of FIG. 3A, a control matrix suitable for use with shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of apertures 412 and 409 coincide. In FIG. 4B the shutter assembly 400 has been moved to the closed state and, as such, the shutter-open actuator 402 is in its relaxed position, the shutter-close actuator 404 has been actuated, and the light blocking portions of shutter 406 are now in position to block transmission of light through the apertures 409 (shown as dotted lines). Each aperture has at least one edge around its periphery. For example, the rectangular apertures 409 have four edges. In alternative implementations in which circular, elliptical, oval, or other curved apertures are formed in the aperture layer 407, each aperture may have only a single edge. In other implementations the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows a predefined overlap 416 between the edge of light blocking portions in the shutter 406 and one edge of the aperture 409 formed in aperture layer 407.

The electrostatic actuators 402 and 404 are designed so that their voltage—displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage $V_m$.

Figure 4C:
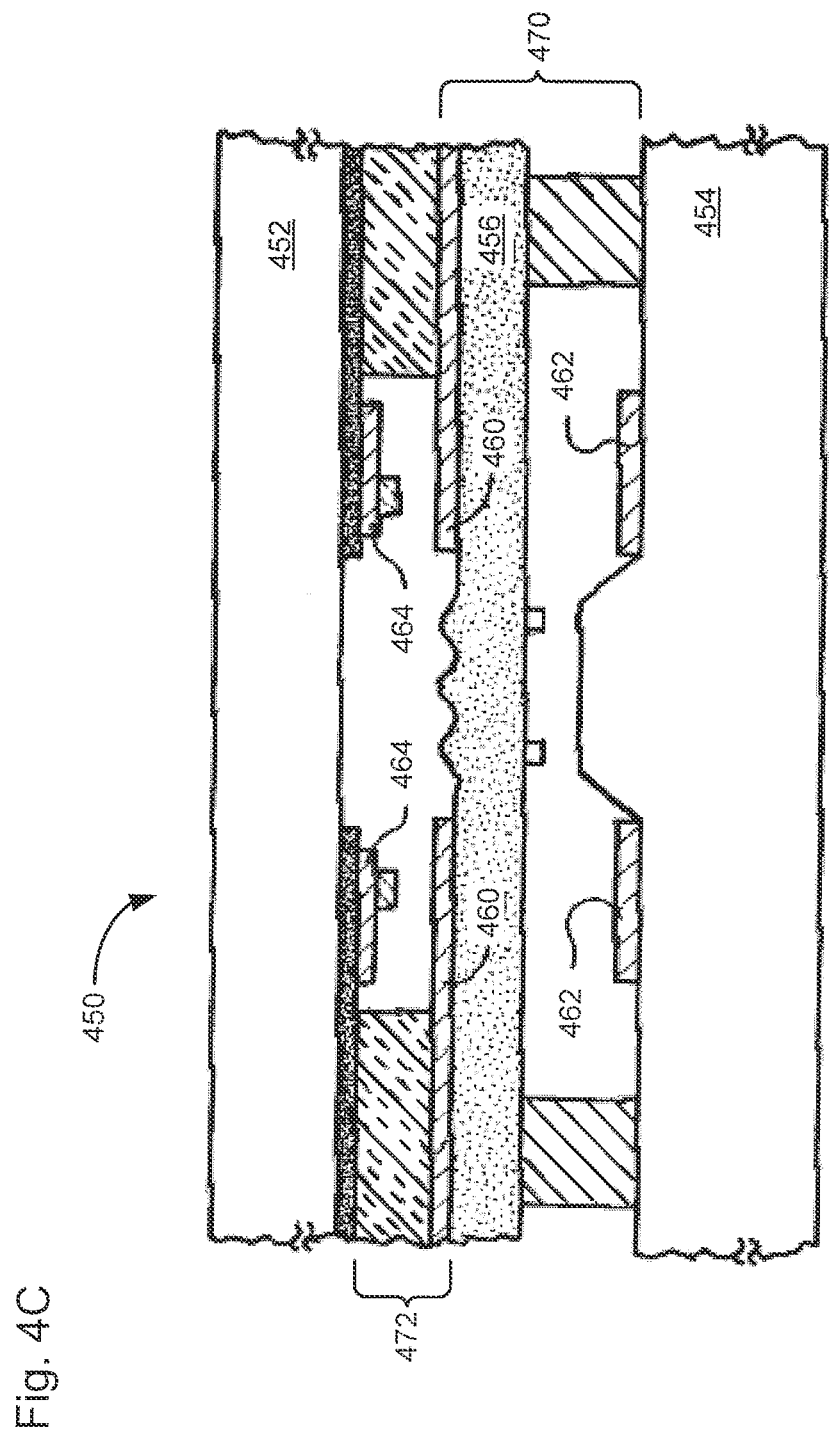
FIG. 4C is a cross sectional view of a dual actuator light tap-based light modulator suitable for incorporation into the MEMS-based display, according to an illustrative embodiment of the invention.

FIG. 4C is a cross-sectional view of a non shutter-based MEMS light modulator 450, which includes first and second opposing actuators. The light modulator 450 is also referred to as a dual actuator light tap, which operates according to the principle of frustrated total internal reflection. The dual actuator light tap is a variation of light tap modulator 250 as described in U.S. Pat. No. 5,771,321, referenced to above. The dual actuator light tap 450 comprises a light guide 454, in which, without interference, light is for the most part unable to escape through its front or rear surfaces due to total internal reflection. The light tap 450 also includes a cover sheet 452 and a flexible membrane or tap element 456. The tap element 456 has a sufficiently high index of refraction such that, in response to the tap element 456 contacting the light guide 454, light impinging on the surface of the light guide 454 adjacent the tap element 456 escapes the light guide 454 through the tap element 456 towards a viewer, thereby contributing to the formation of an image.

The tap element 456 is formed from a flexible transparent material. Electrodes 460 are coupled to the tap element 456. The light tap 450 also includes electrodes 462 and 464. The combination of electrodes 460 and 462 comprise a first actuator 470 and the combination of electrodes 460 and 464 comprise a second opposing actuator 472. By applying a voltage to the first actuator 470 the tap element 456 can be moved toward the light guide 454, allowing light to be extracted from the light guide 454. By applying a voltage to the second actuator 472 the tap element can be moved away from the light guide 454 thereby restricting the extraction of light from the light guide 454.

The actuators 470 and 472 are designed so that their voltage—displacement behavior provides an electrically bi-stable characteristic to the light tap 450. For each of the first and second actuators there exists a range of voltages below the actuation voltage, which if applied while that actuator is in the closed state, will hold the actuator closed and the tap element in position, even after an actuation voltage is applied to the opposing actuator. The minimum voltage needed to maintain the tap element's position against such an opposing force is referred to as a maintenance voltage $V_m$.

Electrical bi-stability arises from the fact that the electrostatic force across an actuator is a strong function of position as well as voltage. The beams of the actuators in the light modulators 400 and 450 act as capacitor plates. The force between capacitor plates is proportional to $1/d^2$ where d is the local separation distance between capacitor plates. In a closed actuator, the local separation between actuator beams is very small. Thus, the application of a small voltage can result in a relatively strong force between the actuator beams of a closed actuator. As a result, a relatively small voltage, such as $V_m$, can keep the actuator closed, even if other elements exert an opposing force on the closed actuator.

In light modulators, such as 400 and 450, that provide two opposing actuators (e.g. for the purpose of opening and closing a shutter respectively), the equilibrium position of the modulator will be determined by the combined effect of the voltage differences across each of the actuators. In other words, the electrical potentials of all three terminals (e.g. the shutter open drive beam, the shutter close drive beam, and the shutter/load beams), as well as modulator position, must be considered to determine the equilibrium forces on the modulator.

For an electrically bi-stable system, a set of logic rules can describe the stable states and can be used to develop reliable addressing or digital control schemes for the modulator. Referring to the shutter-based light modulator 400 as an example, these logic rules are as follows:

Let $V_s$ be the electrical potential on the shutter or load beam. Let $V_o$ be the electrical potential on the shutter-open drive beam. Let $V_c$ be the electrical potential on the shutter-close drive beam. Let the expression $/V_o-V_s/$ refer to the absolute value of the voltage difference between the shutter and the shutter-open drive beam. Let $V_m$ be the maintenance voltage. Let $V_{at}$ be the actuation threshold voltage, i.e., the voltage necessary to actuate an actuator absent the application of $V_m$ to an opposing drive beam. Let $V_{max}$ be the maximum allowable potential for $V_o$ and $V_c$. Let $V_m < V_{at} < V_{max}$. Then, assuming $V_o$ and $V_c$ remain below $V_{max}$:

1. If $/V_o-V_s/<V_m$ and $/V_c-V_s/<V_m$

Then the shutter will relax to the equilibrium position of its mechanical spring.

2. If $/V_o-V_s/>V_m$ and $/V_c-V_s/>V_m$

Then the shutter will not move, i.e. it will hold in either the open or the closed state, whichever position was established by the last actuation event.

3. If $/V_o-V_s/>V_{at}$ and $/V_c-V_s/<V_m$

Then the shutter will move into the open position.

4. If $/V_o-V_s/<V_m$ and $/V_c-V_s/>V_{at}$

Then the shutter will move into the closed position.

Following rule 1, with voltage differences on each actuator near to zero, the shutter will relax. In many shutter assemblies the mechanically relaxed position is only partially open or closed, and so this voltage condition is preferably avoided in an addressing scheme.

The condition of rule 2 makes it possible to include a global actuation function into an addressing scheme. By maintaining a shutter voltage which provides beam voltage differences that are at least the maintenance voltage, $V_m$, the absolute values of the shutter open and shutter closed potentials can be altered or switched in the midst of an addressing sequence over wide voltage ranges (even where voltage differences exceed $V_{at}$) with no danger of unintentional shutter motion.

The conditions of rules 3 and 4 are those that are generally targeted during the addressing sequence to ensure the bi-stable actuation of the shutter.

The maintenance voltage difference, $V_m$, can be designed or expressed as a certain fraction of the actuation threshold voltage, $V_{at}$. For systems designed for a useful degree of bi-stability the maintenance voltage can exist in a range between 20% and 80% of $V_{at}$. This helps ensure that charge leakage or parasitic voltage fluctuations in the system do not result in a deviation of a set holding voltage out of its maintenance range—a deviation which could result in the unintentional actuation of a shutter. In some systems an exceptional degree of bi-stability or hysteresis can be provided, with $V_m$ existing over a range of 2% to 98% of $V_{at}$. In these systems, however, care must be taken to ensure that an electrode voltage condition of $V<V_m$ can be reliably obtained within the addressing and actuation time available.

Figure 5A:
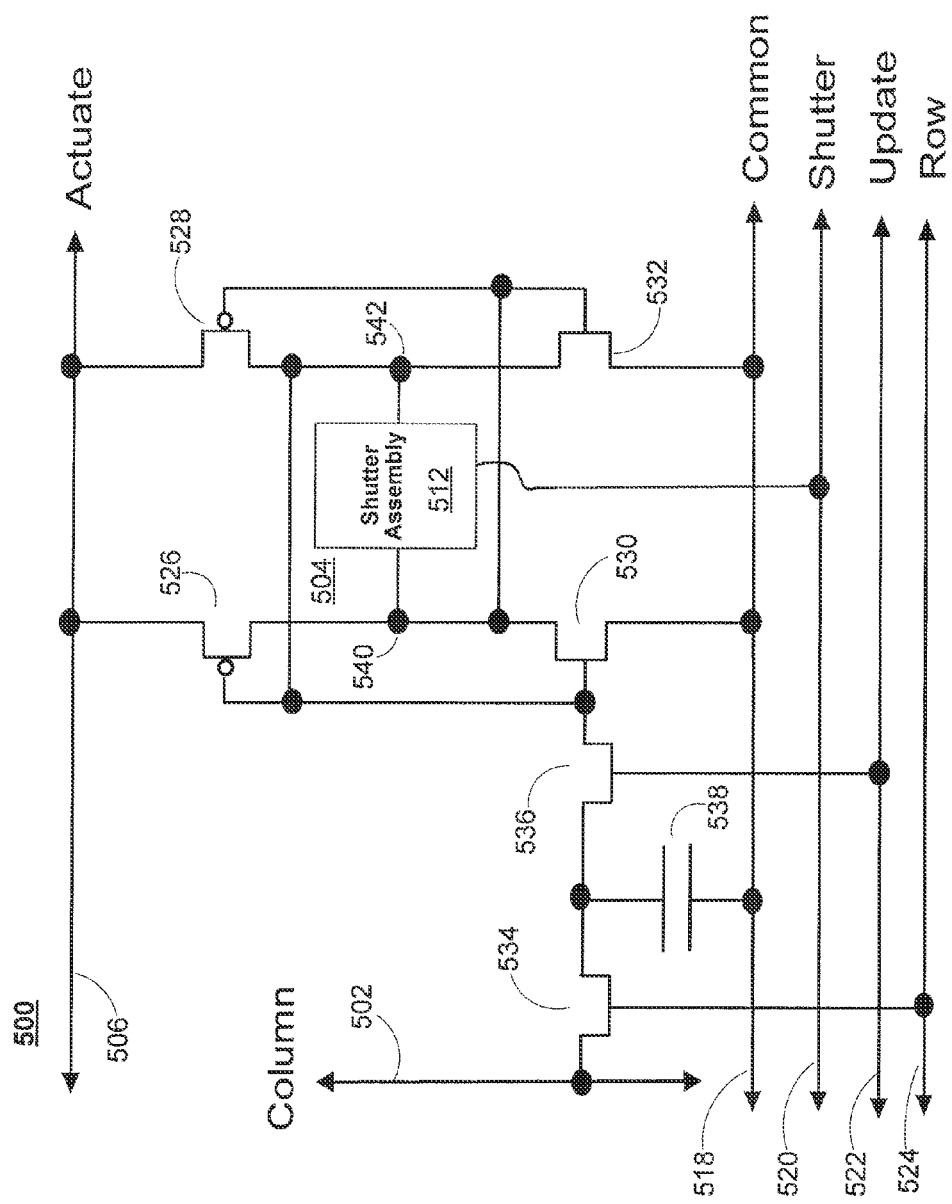
FIG. 5A is a diagram of a control matrix suitable for controlling the shutter assemblies of the display apparatus of FIG. 1A, according to an illustrative embodiment of the invention.

FIG. 5A illustrates an alternative control matrix 500, suitable for inclusion in the display apparatus 100, according to an illustrative embodiment of the invention. Control matrix 500 controls an array of pixels 504 that include dual-actuator shutter assemblies 512. Dual actuator shutter assemblies, such as shutter assembly 400, are shutter assemblies that include separate shutter-open and shutter-close actuators. Although only one pixel 504 is illustrated in FIG. 5A, it is understood that the control matrix extends and incorporates a large number of rows and columns of similar pixels, as is partially illustrated by the control matrix 300 of FIG. 3A. In addition, the control matrix may be used with any suitable type of MEMS modulators and actuators, such as elastic modulators, single-actuator modulators, non-shutter based modulators, and modulators 200, 220, 250, 270, 400 and 450 without departing from the scope of the invention. The control matrix 500 includes column line interconnect 502 for each column of pixels 504 in the control matrix. The actuators in the shutter assemblies 504 can be made either electrically bi-stable or mechanically bi-stable. The light control matrix 500 is depicted as having a single MEMS light modulator per pixel. Other embodiments are possible in which multiple MEMS light modulators are provided in each pixel, thereby providing the possibility of more than just binary "on' or "off" optical states in each pixel. Certain forms of coded area division gray scale are possible where multiple MEMS light modulators in the pixel are provided, and where apertures, which are associated with each of the light modulators, have unequal areas.

The control matrix 500 includes a plurality of lines, herein referred to as "global lines" common to the entire display, composed of a plurality of identical pixels arranged in a row and column fashion. These global lines include the actuate line interconnect 506 the common line interconnect 518, the shutter line interconnect 520, and the update line interconnect 522 In some embodiments these global lines are operated as one node across the entire display. For example, the entire update node across the display, or the entire actuate node across the display is changed at the same time. In some embodiments, these global line interconnects can be grouped into pixel sub-groups. For example, each odd row of pixels may have their global lines connected, and each even row of pixels' global lines may be separately connected so that odd rows may be operated independently of even rows. The control matrix 500 includes a row line, 524, unique to each row arrangement of pixels and a column line, 502, unique to each column arrangement of pixels. Each pixel 504 in the control matrix includes a data loading transistor 534, a data store capacitor 538, an update transistor 536, actuator nodes 540 and 542, and a dual inverter latch. In control matrix 500, the data store capacitor 538 is connected to the common line interconnect 518. However, in some embodiments the data store capacitor 538 may be connected to the shutter line interconnect 520. In some embodiments, the common line interconnect 518 can serve as the next row's row interconnect 524, and therefore eliminating the common line interconnect 518 altogether.

The dual inverter latch includes a first inverter comprised of transistors 526 and 530, and a second inverter comprised of transistors 528 and 532. Shutter assemblies 512 include electrostatic actuators, similar to actuator 204 of shutter assembly 200, connected to the actuator nodes 540 and 542. When a voltage difference equal to or greater than an actuation voltage, also referred to as a charging voltage or $V_{at}$, is imposed between the actuators and the shutter, the shutter assembly can be driven into an open state allowing passage of light, or a closed state, blocking the passage of light. The control matrix 500 makes use of two complementary types of transistors: both p-channel and n-channel transistors. It is therefore referred to as a complementary MOS control matrix or a CMOS control matrix. While the data loading transistor 534, update transistor 536 and the lower transistors of the cross-coupled inverters 530 and 532 are made of the nMOS type, the upper transistors of the cross-coupled inverter 526 and 528 are made of the pMOS type of transistor. Those of skill in the art will recognize that in other implementations, the types of CMOS transistors can be reversed (i.e., pMOS switched with nMOS), or other types of transistors may be used (i.e., BJT, JFET or any other suitable type of transistor).

In some embodiments, actuate line 506 is connected to a voltage source that is maintained equal to or greater than $V_{at}$. The shutter line 520 is maintained near to the ground potential. In some embodiments, the shutter polarity may be maintained at the full actuation voltage (i.e., approximately 25 volts). In certain embodiments, the polarity of the shutter may be periodically alternated between one or more potentials as necessary. For example, the shutter may be alternated between 25 volts and 0 volts after each full video frame, or in other cases, more or less frequently. The shutter polarity may be controlled by applying the necessary voltage to the shutter line interconnect 520. In some embodiments, the polarity of the data is alternated, as well, corresponding to the shutter potential being alternated.

Each actuator node 540 and 542 is connected to actuate line 506 depending on the "on/off" state of its respective transistor 526 and 528. For example, when the transistor 526 connected to the left actuator node 540 is in an "on" state, charge is allowed to flow from the actuate line 506 to the actuator node 540. Then, a voltage of approximately $V_{at}$ will be imposed between the actuator connected to the actuator node 540 and the shutter (assuming the shutter is at common potential), and the shutter will be driven into its desired state. A similar process occurs when transistor 526 is in an "off" state and transistor 528 is in an "on" state, which results in driving the shutter into the opposite state. In some embodiments, a voltage of approximately $V_{at}$ will be applied to the actuator connected to the actuator node 540 and a similar voltage applied to the shutter, thereby creating a 0 volt potential between the shutter and actuator.

The control matrix 500 includes a data store capacitor 538. As described further below, the capacitor 538 stores, by means of stored charge, "data" instructions (e.g., open or close) that are sent by a controller, such as controller 156, to the pixel 504 as part of a data loading or writing operation. The voltage stored on the capacitor 538 determines, in part, the latch state of the dual inverter latch in control matrix 500.

During a data load operation, each row of the array is write-enabled in an addressing sequence. The voltage sources in control matrix 500 (not shown) apply a write-enabling voltage to the row line interconnect 524 corresponding to a selected row. The application of voltage to the row line interconnect 524 for the write-enabled row turns on the data-loading transistor 534 of the pixels 504 in the corresponding row line, thereby write enabling the pixels. While a selected row of pixels 504 is write-enabled, data voltage sources apply appropriate data voltages to the column interconnect 502 corresponding to each column of pixels 504 in the control matrix 500. The voltages applied to the column interconnects 502 are thereby stored on the data store capacitors 538 of the respective pixels 504. In certain embodiments, the voltages applied to column interconnect 502 may be negative or positive (e.g., ranging from −5 to 5 volts).

Figure 5B:
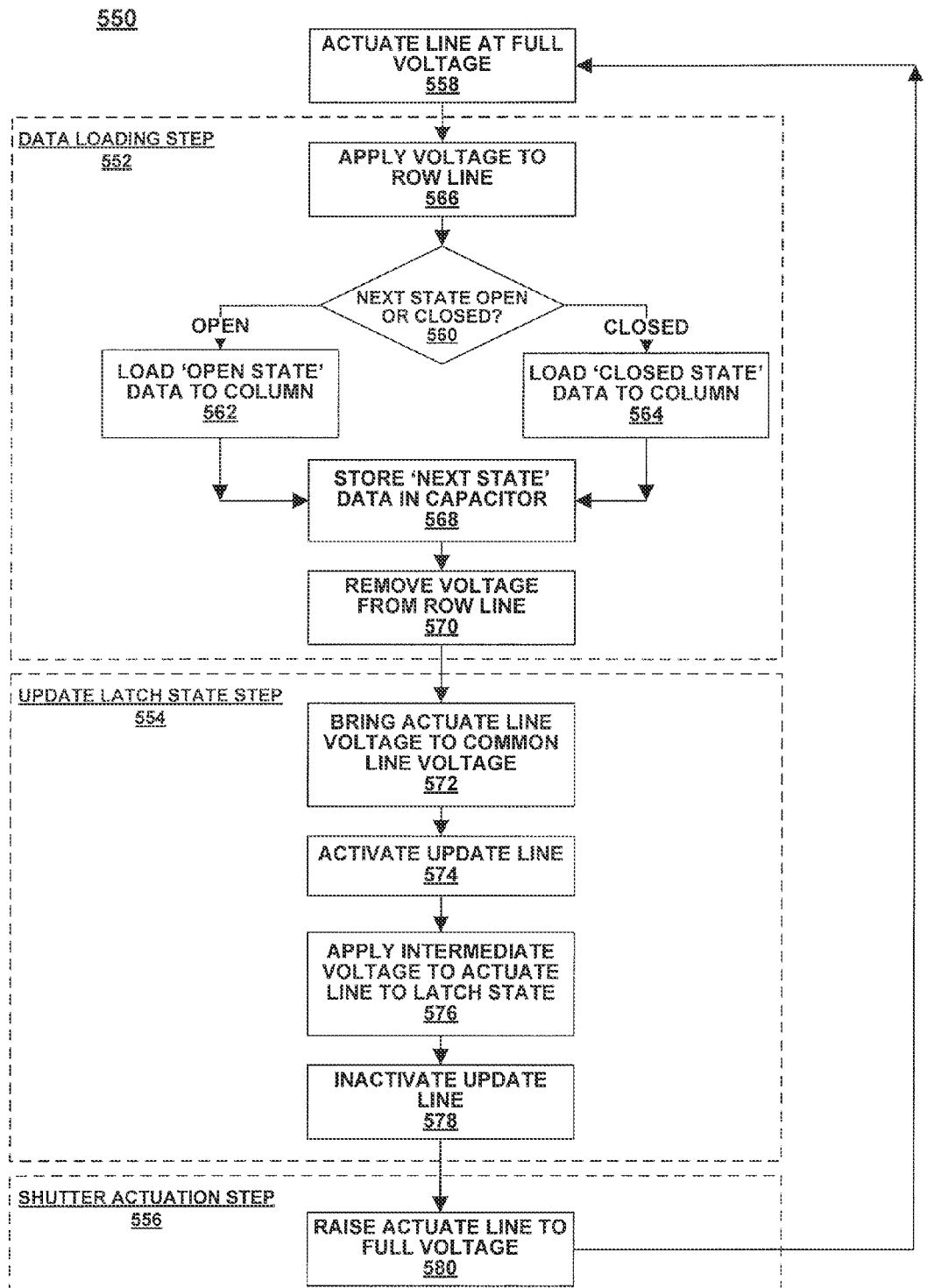
FIG. 5B is a flow chart of a method of addressing the pixels of the control matrix of FIG. 5A, according to an illustrative embodiment of the invention.

A method of addressing pixels in control matrix 500 is illustrated by the method 550 shown in FIG. 5B. The method 550 proceeds in three general steps. First, data is loaded row by row to each pixel in the data loading step 552. Next, the latch for each pixel is set to the correct state based, at least in part, on the stored data in the update latch state step 554. Finally, the shutters are actuated in the shutter actuation step 556.

In more detail, the frame addressing cycle of method 550 begins in a held data state with the actuate line 506 at the full voltage $V_{at}$ needed to reliably actuate the shutter to the appropriate actuator node (Step 558). For example this voltage may be approximately 20-30 volts. The control matrix 500 then proceeds with the data loading step 552 by addressing each pixel 504 in the control matrix, one row at a time (steps 556-570). To address a particular row, the control matrix 500 write-enables a first row line by applying a voltage to the corresponding row-line interconnect 524 (step 566), effectively switching the data loading transistor 534 to a conductive "on" state. Then, at decision block 560, the control matrix 500 determines for each pixel 504 in the write-enabled row whether the pixel 504 needs to be open or closed in the next state. For example, at step 560 it is determined for each pixel 504 in the write-enabled row whether or not the pixel is to be (subsequently) changed from its current state or kept the same. If a pixel 504 is to be opened, the control matrix 500 loads a particular data voltage $V_d$, for example 1.5V, to the column interconnect 502 corresponding to the column in which that pixel 504 is located (step 562). If a pixel 504 is to be closed, the control matrix 500 loads a particular data voltage $V_d$, for example −1.5V, to the column interconnect 502 corresponding to the column in which that pixel 504 is located (step 564). The data voltage $V_d$ applied to the column interconnect 502, corresponding to the next state of the shutter, is then stored by means of a charge on the data store capacitor 538 of the selected pixel 504 (step 568). Next, the voltage is removed from the row line 524 (step 570), effectively switching the data loading transistor 534 to a non-conducting "off" state. Once data loading transistor 534 is set to the "off" state, column line 502 is ready to load the data voltage $V_d$ for the next state.

The data voltage $V_d$ can be set at any time as long as it is valid when the row line 524 is turned off, so that the correct data is on the data storage capacitor 538 when data loading transistor 534 becomes non conductive. During the data loading step 552, the update line 522 is inactive, thereby isolating the data storage capacitor 538 from the current state held by the transistors 526-532 of the cross-coupled inverter latch.

After all data for the next state has been stored on capacitors 538 in the selected rows in data loading step 552 (steps 566-570), the control matrix 500 then proceeds with the update latch step 554 to update portions or banks of the pixels, or the entire display to the next held state. The update latch sequence begins at step 572 of method 550 by bringing the voltage on the actuate line 506 down, or close, to the voltage on the common line 518. This brings the voltages on both the actuator nodes 540 and 542 close to the same voltage as the common line 518. Next, the update line 522 is activated in step 574, thereby switching the update transistor 536 to a conductive "on" state and allowing the stored data to be passed from the data store capacitor 538 to the transistors 526-532 of the cross-coupled inverter latch. If the update line 522 is activated (step 574) too early after the actuate line 506 voltage is brought to the common line 518 voltage (step 572), the stored next state of the next state data can be corrupted by present state data of the latch that has not had enough time to decay away. This necessary non-overlap timing can be a function of circuit parasitics, transistor threshold voltages, capacitor size and stored data voltage levels. For example, the delay needed between steps 572 and 574 may be approximately 10 μs, however this delay time may be considerably longer or shorter depending on the display.

An intermediate voltage just high enough to make the latch transistors operate (e.g. approximately equal to the sum of the threshold voltages of the inverter transistors 526 and 530 or 528 and 532. The level can be significantly less, limited by the details of needed timings, parasitic charge injections, detailed transistor characteristics, and the like.) is applied to the actuate line 506 in step 576. The intermediate voltage applied to the actuate line 506 in step 576 functions to minimize the power used to latch to the next state. In certain embodiments, the cross-coupled inverter latch is latched at as low an intermediate voltage level as can be reliably performed in order to reduce overall transient switching power. Steps 574 and 576 cause the data stored on data store capacitor 538 to be latched in the cross-coupled inverter latch of pixel 504.

Step 576 may be performed simultaneously to, before or after activating the update line 522 in step 574. For example, in certain embodiments, applying an intermediate voltage to the actuate line 506 in step 576 can be done completely after the update pulse created in steps 574 and 578 or the intermediate voltage pulse created in step 576 can partially or fully overlap with the update voltage pulse. In some embodiments, control of the next state of the cross-coupled inverter latch is executed by overlap of the two states, particularly if parasitic capacitances of the data latch are low.

Finally, the update line 522 is inactivated in step 578, thereby switching the update transistor 536 to a non-conductive "off" state and isolating the data store capacitor 538 from the cross-coupled inverter latch of pixel 504. By inactivating the update line 522 (step 578) before raising the actuate line to full voltage (step 580) significant power is conserved by not allowing the data storage capacitor 538 to be charged to the full actuation voltage.

On the other hand, it is possible to not have the update transistor, 536, at all. In this case the data loading operation would directly change the latch state as it is loaded row by row. This could happen by simultaneously lowering the actuate node to the appropriate intermediate level or to approximately 0 then to the intermediate level on a row by row basis as well to allow for lower data voltages to determine the latch state, or by lowering the actuate node for the entire display to an appropriate intermediate level during the entire data loading operation, or, if power is not a concern, or the actuation voltages are low enough to make the power a secondary concern, the data voltages could be at full actuation voltage levels, or more, with the actuate node maintained at the full Vac, to force the latch to the desired state. Also, by eliminating update transistor 536, layout area may be saved.

Once the data has been transferred and the latch state updated in step 554, the control matrix 500 proceeds with the shutter actuation step 556 to move the shutters, of shutter assemblies 512, to their next state. Shutter actuation step 556 includes raising the actuate line 506 to full voltage in step 580. Full voltage may be the voltage necessary to actuate the shutter to one side or the other and to hold the shutter in that position until the next frame addressing cycle. Because the latch state was set earlier during the update latch state step 554, there is no conduction path from the actuate line 506 through the two transistors in series in each inverter (526 and 530 or 528 and 532). Thus, only current meant to charge the actuation of the shutter capacitance and various parasitic capacitance is allowed to flow, resulting in minimal power dissipation. After the shutters are actuated in step 556, method 550 returns to the beginning of the pixel addressing cycle.

The action of the cross coupled inverter latch in control matrix 500 requires only one shutter transition time to get to its next state. Previous methods of display control require two shutter transition times to fully update the entire display. This difference of time for the extra shutter transition can be significant for more complicated display algorithms where many display updates are done in one video frame time. Additionally, control matrix 500 creates a held data state where only one actuator is attractive to the shutter and the other actuator is not attractive. This helps to prevent erroneous shutter states.

In certain embodiments, it is possible to approximate the dual voltage level actuate operation to reduce latching transients in the cross-coupled inverter latch by slewing the actuate line 506 voltage slow enough that the latching operation of the cross coupled inverter latch happens at a low voltage, thus saving power. The timing of the update signal relative to the actuate node voltage level allows for control of excessive charging of the data storage capacitor 538 to assure lower power operation.

Figure 6:
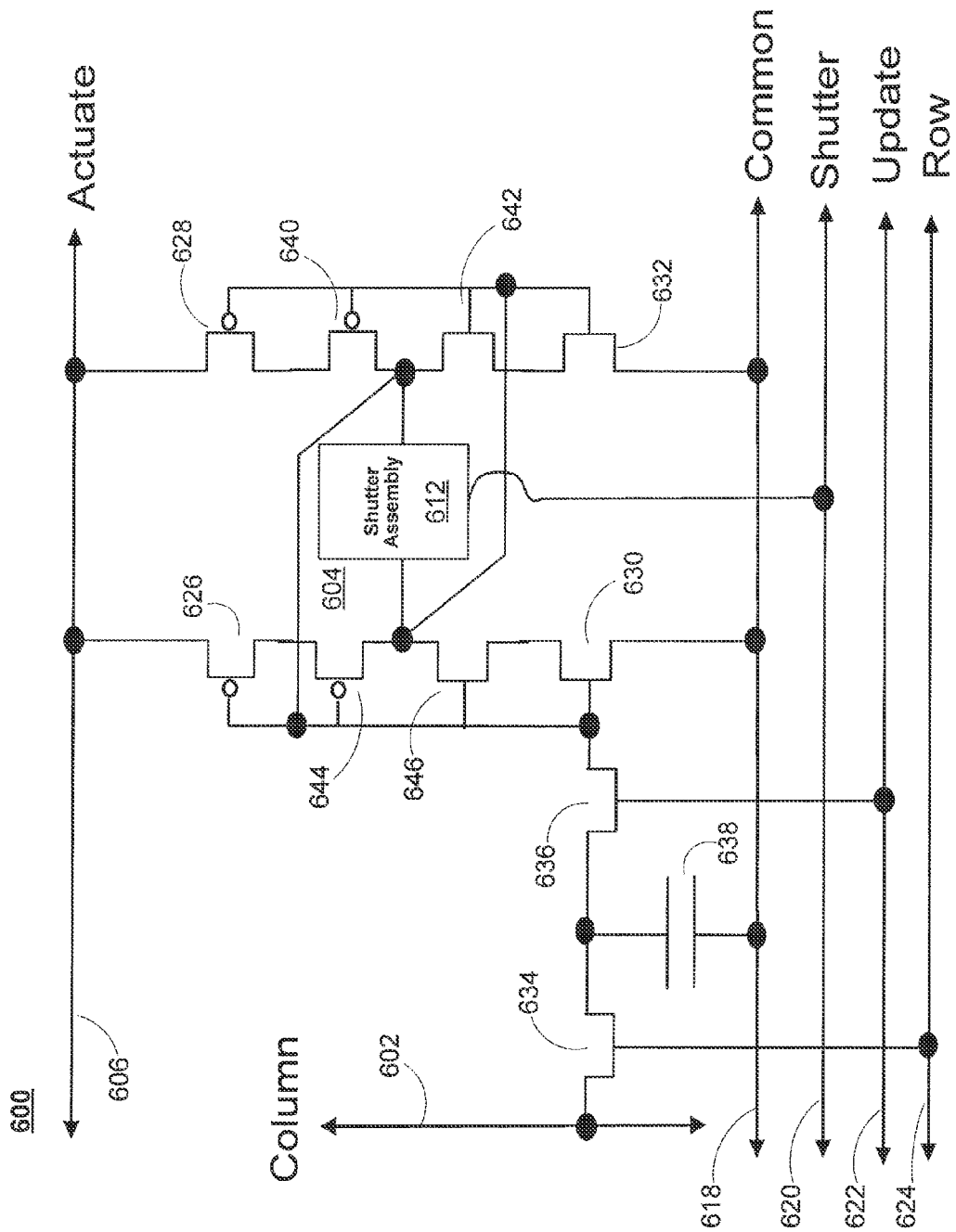
FIG. 6 is a diagram of a control matrix suitable for controlling the shutter assemblies of the display apparatus of FIG. 1A, according to an illustrative embodiment of the invention.

FIG. 6 is another suitable control matrix 600 for inclusion in the display apparatus 100, according to an illustrative embodiment of the invention. Similarly to control matrix 500, control matrix 600 controls an array of pixels that include dual-actuator shutter assemblies 612. However, any type of MEMS shutter and actuators assembly may be used without departing from the scope of the invention.

The control matrix 600 also includes a plurality of global lines common to the entire display, composed of a plurality of identical pixels arranged in a row and column fashion. These global lines include the actuate line interconnect 606 the common line interconnect 618, the shutter line interconnect 620, and the update line interconnect 622 In some embodiments these global lines are operated as one node across the entire display. For example, the entire update node across the display, or the entire actuate node across the display is changed at the same time. In some embodiments, these global line interconnects can be grouped into pixel sub-groups. For example, each odd row of pixels may have their global lines connected, and each even row of pixels' global lines may be separately connected so that odd rows may be operated independently of even rows. The control matrix 600 includes a row line, 624, unique to each row arrangement of pixels and a column line, 602, unique to each column arrangement of pixels. Each pixel 604 in the control matrix 600 includes a data loading transistor 634, a data store capacitor 638, an update transistor 636, and a dual inverter latch. The dual inverter latch of control matrix 600 includes a first inverter with dual gate transistors including transistors 626, 644, 646 and 630 connected in series, and a second inverter with dual gate transistors including transistors 628, 640, 642 and 632 connected in series.

Control matrix 600 operates in a similar manner to control matrix 500 and as described in method 550. However, control matrix 600 includes four added transistors forming dual gate transistors in the cross-coupled inverters of pixel 604. The dual gate transistors of control matrix 600 are connected in series and have a common gate potential. This allows for operation of control matrix 600 at higher actuation voltages. For example, many thin film transistors are rated to withstand approximately 15 volts. The dual gate transistors of control matrix 600 operate to partially share the voltage stress and allow for the application of higher actuation voltages (i.e. 15-30 volts) to the shutter actuators. The dual gate transistor design of matrix 600 does not require an added interconnect.

Figure 7:
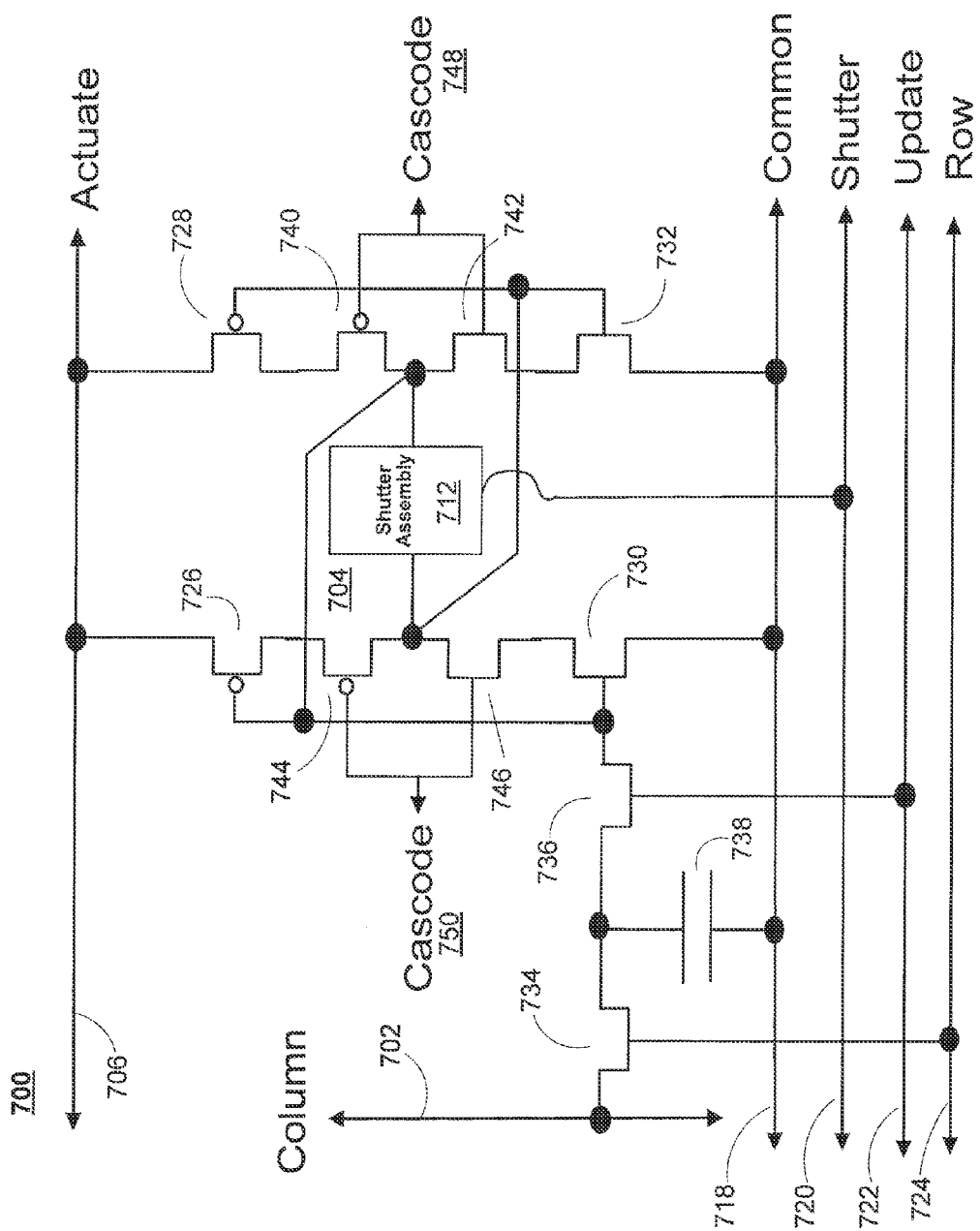
FIG. 7 is a diagram of a control matrix suitable for controlling the shutter assemblies of the display apparatus of FIG. 1A, according to an illustrative embodiment of the invention.

FIG. 7 is another suitable control matrix 700 for inclusion in the display apparatus 100, according to an illustrative embodiment of the invention. Similarly to control matrix 500, control matrix 700 controls an array of pixels that include dual-actuator shutter assemblies 712. However, any type of MEMS shutter and actuators assembly may be used without departing from the scope of the invention.

The control matrix 700 also includes a plurality of global lines common to the entire display, composed of a plurality of identical pixels arranged in a row and column fashion. These global lines include the actuate line interconnect 706 the common line interconnect 718, the shutter line interconnect 720, and the update line interconnect 722 In some embodiments these global lines are operated as one node across the entire display. For example, the entire update node across the display, or the entire actuate node across the display is changed at the same time. In some embodiments, these global line interconnects can be grouped into pixel sub-groups. For example, each odd row of pixels may have their global lines connected, and each even row of pixels' global lines may be separately connected so that odd rows may be operated independently of even rows. The control matrix 700 includes a row line, 724, unique to each row arrangement of pixels and a column line, 702, unique to each column arrangement of pixels. Each pixel 704 in the control matrix 700 includes a data loading transistor 734, a data store capacitor 738, an update transistor 736, and a dual inverter latch. The dual inverter latch of control matrix 700 includes a first inverter including transistors 726, 744, 746 and 730 connected in series and cascode 750 connected to the gates of cascode transistors 744 and 746, and a second inverter including transistors 728, 740, 742 and 732 connected in series and cascode 748 is connected to the gates of cascode transistors 740 and 742. In practice cascodes 748 and 750 are connected to the same cascode node, however, this is not shown in FIG. 7 for purposes of clarity.

Control matrix 700 operates in a similar manner to control matrix 500 and as described in method 550. However, control matrix 700 includes four added transistors and a cascode node 748 connected to the cross-coupled inverters of pixel 604. The cascodes of control matrix 700 operate to keep all transistors in the cross-coupled inverter at an approximate maximum of ½ the voltage on the actuate line 706, and allow the cascode transistors 744 and 746, and 740 and 742 to act as shields for excessive voltage on the other transistors in the inverters (726, 730 and 728, 732). The cascode node is pulsed with the actuate line 706 voltage at all times (i.e., both during the update sequence as well as during the held data state). For example, the cascode node may be pulsed in such a way that it follows the actuate node at approximately ½ its potential. This allows for operation of control matrix 700 at actuation voltages even higher than that of control matrix 600. The use of cascodes are explained in more detail in U.S. patent application Ser. No. 11/811,842, which is incorporated herein by reference.

Figure 8:
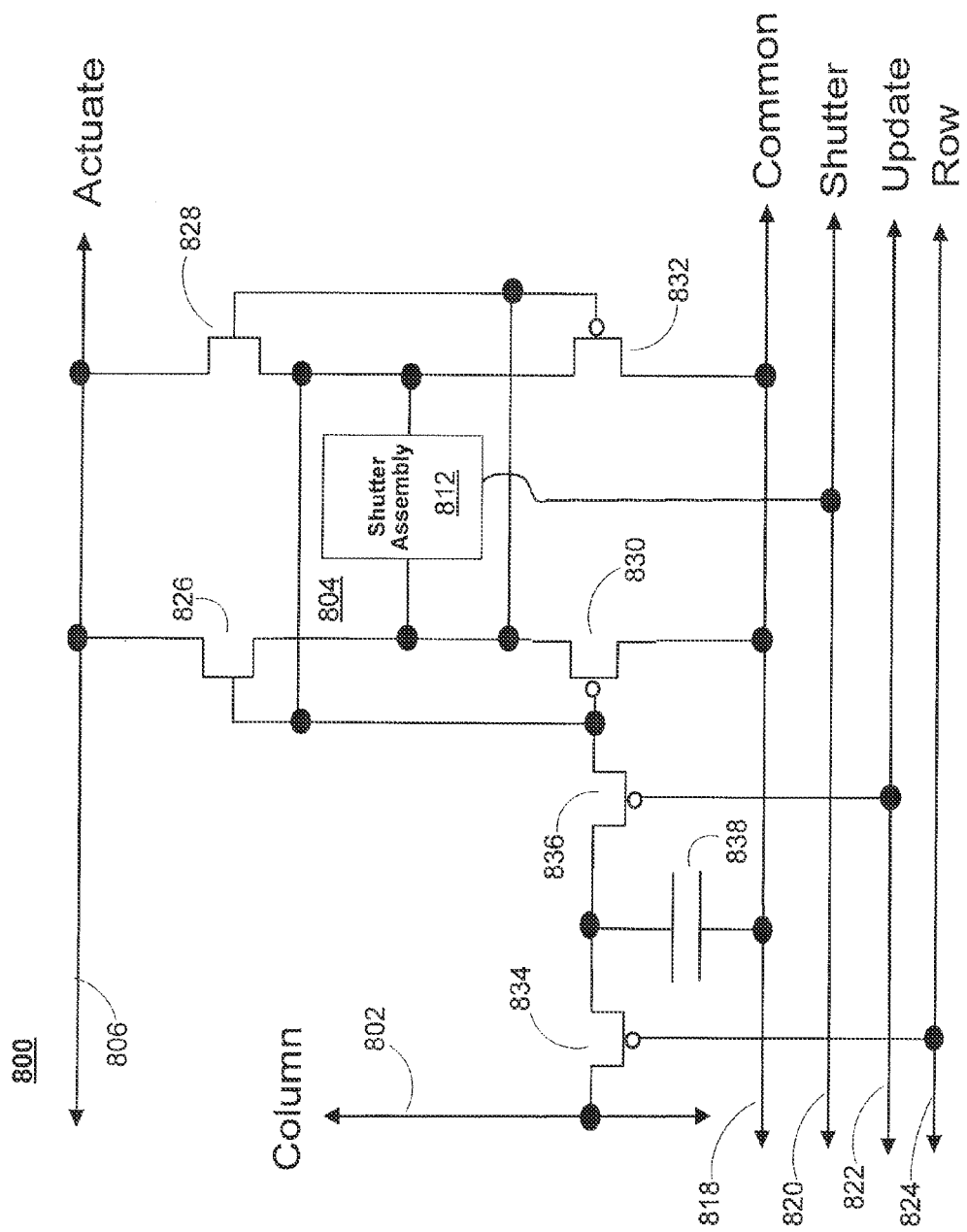
FIG. 8 is a diagram of a control matrix suitable for controlling the shutter assemblies of the display apparatus of FIG. 1A, according to an illustrative embodiment of the invention.

FIG. 8 is another suitable control matrix 800 for inclusion in the display apparatus 100, according to an illustrative embodiment of the invention. Similarly to control matrix 500, control matrix 800 controls an array of pixels that include dual-actuator shutter assemblies 812. However, any type of MEMS shutter and actuators assembly may be used without departing from the scope of the invention.

The control matrix 800 also includes a plurality of global lines common to the entire display, composed of a plurality of identical pixels arranged in a row and column fashion. These global lines include the actuate line interconnect 806 the common line interconnect 818, the shutter line interconnect 820, and the update line interconnect 822. In some embodiments these global lines are operated as one node across the entire display. For example, the entire update node across the display, or the entire actuate node across the display is changed at the same time. In some embodiments, these global line interconnects can be grouped into pixel sub-groups. For example, each odd row of pixels may have their global lines connected, and each even row of pixels' global lines may be separately connected so that odd rows may be operated independently of even rows. The control matrix 800 includes a row line, 824, unique to each row arrangement of pixels and a column line, 802, unique to each column arrangement of pixels. Each pixel 804 in the control matrix 800 includes a data loading transistor 834, a data store capacitor 838, an update transistor 836, and a dual inverter latch. The dual inverter latch of control matrix 800 includes a first inverter including transistors 826 and 830, and a second inverter including transistors 828 and 832.

Control matrix 800 operates in a similar manner to control matrix 500 and as described in method 550. However, the transistors 826-836 control matrix 800 are flipped with respect to the control matrix 500 (i.e., pMOS to nMOS and vise versa). It is known by those of skill in the art that the transistors of control matrices 600 and 700 may be flipped in a similar manner. In control matrix 800, the data loading transistor 834, update transistor 836 and the two bottom transistors of the cross-coupled inverter 830 and 832 are pMOS, while the two upper transistors on the cross-coupled inverter 826 and 828 are nMOS. The control matrix 800 functions in a similar manner to that of control matrix 500 and as described in method 550, however the polarities of the voltages may be reversed.

Figure 9A:
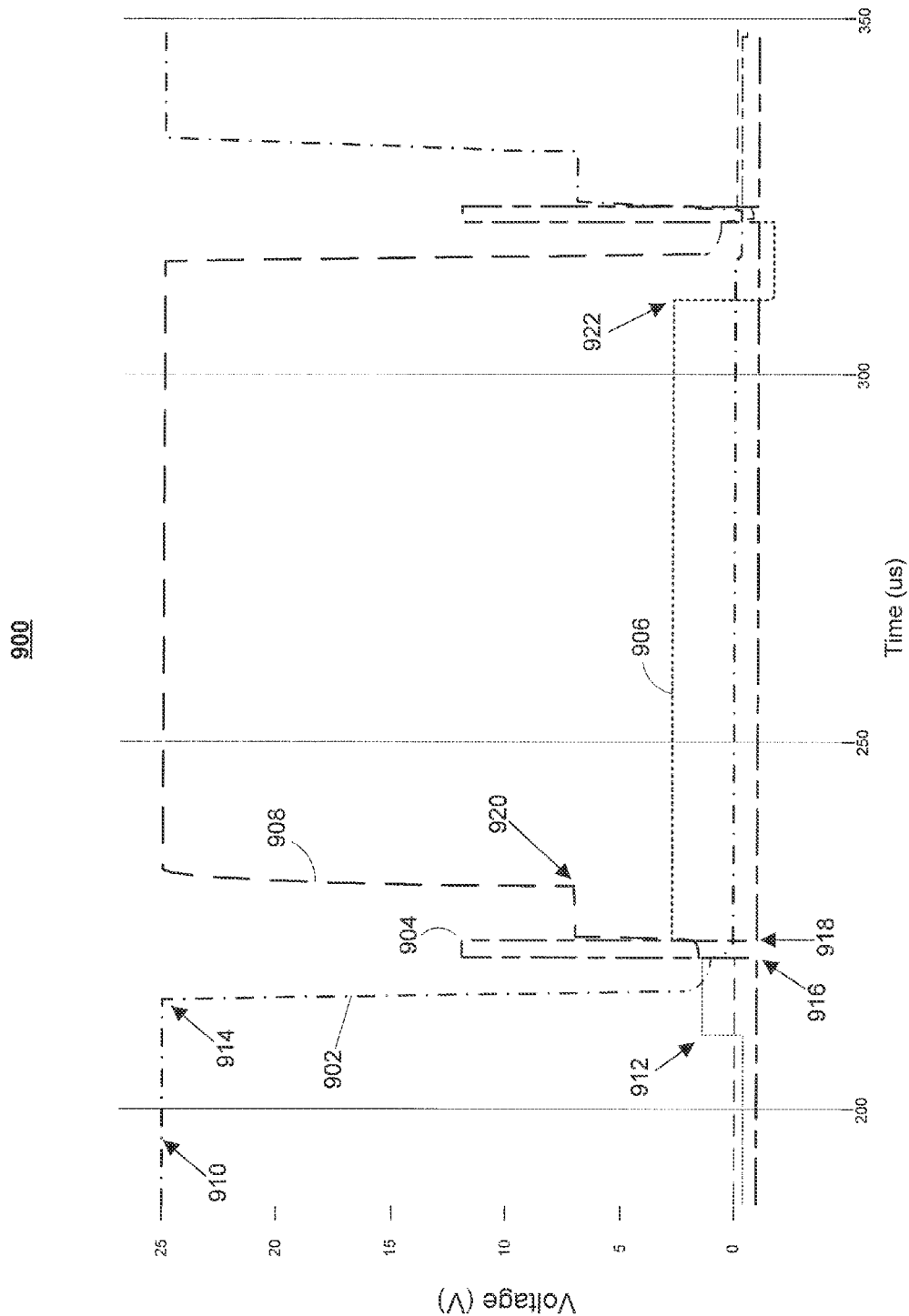
FIG. 9A is a chart of voltage variations vs. time during pixel operation, according to an illustrative embodiment of the invention.

FIG. 9A is a chart 900 of voltage variations vs. time during pixel operation using control matrix 500, according to an illustrative embodiment of the invention. For example, chart 900 may be the voltage variations resulting from applying method 550 to the control matrix 500. Plot 902 represents the voltage variation vs. time on actuator node 540. Plot 904 represents the voltage variation vs. time on update line 522. Plot 906 represents the voltage variation vs. time on data store capacitor 538. Plot 908 represents the voltage variation vs. time on the opposite actuator node 542. Reference numbers 910-922 represent events corresponding to method 550.

Starting at event 910, the voltage 902 on actuator node 540 is at full voltage (approximately 25 volts). This corresponds to the actuate line 506 being at full voltage in step 558 of method 550. During this phase, the shutter is held attractive to actuator node 540 in its current state. At event 912, the next state data is stored in the data store capacitor 538 corresponding to step 568 of method 550. The voltage 906 on the data store capacitor 538 increases at event 912 to reflect the stored data. Next, at event 914, the actuate line 506 voltage is brought to common line 518 voltage corresponding to step 572 of method 550. After event 914, the voltage 902 on actuator node 540 decreases dramatically. At event 916, the update line 522 is activated, corresponding to step 574 of method 550. When the update line is activated, the voltage 904 on the update line increases to approximately 12 volts for a very short period of time until update line 522 is inactivated at event 918, corresponding to step 578 of method 550. Also, at event 918, an intermediate voltage is applied to actuate line 506, corresponding to step 576 of method 550, to set the latch state on the cross-coupled inverters. As described above, in certain embodiments, the intermediate voltage may be applied to actuate line 506 before, during or after event 918 when the update line 522 is inactivated. As shown in chart 900, the intermediate voltage 908 applied to the actuate line 506 may be approximately 7 volts. Finally, at event 920, the actuate line 506 is raised to full voltage, corresponding to step 580 of method 550, causing the voltage on the opposite actuator node 542 to increase to approximately 25 volts. During this phase, the shutter is attracted to actuator node 542 and is held there until the next frame addressing cycle. At event 922, data is stored on the data store capacitor 538 for the next state in the frame addressing cycle.

Figure 9B:
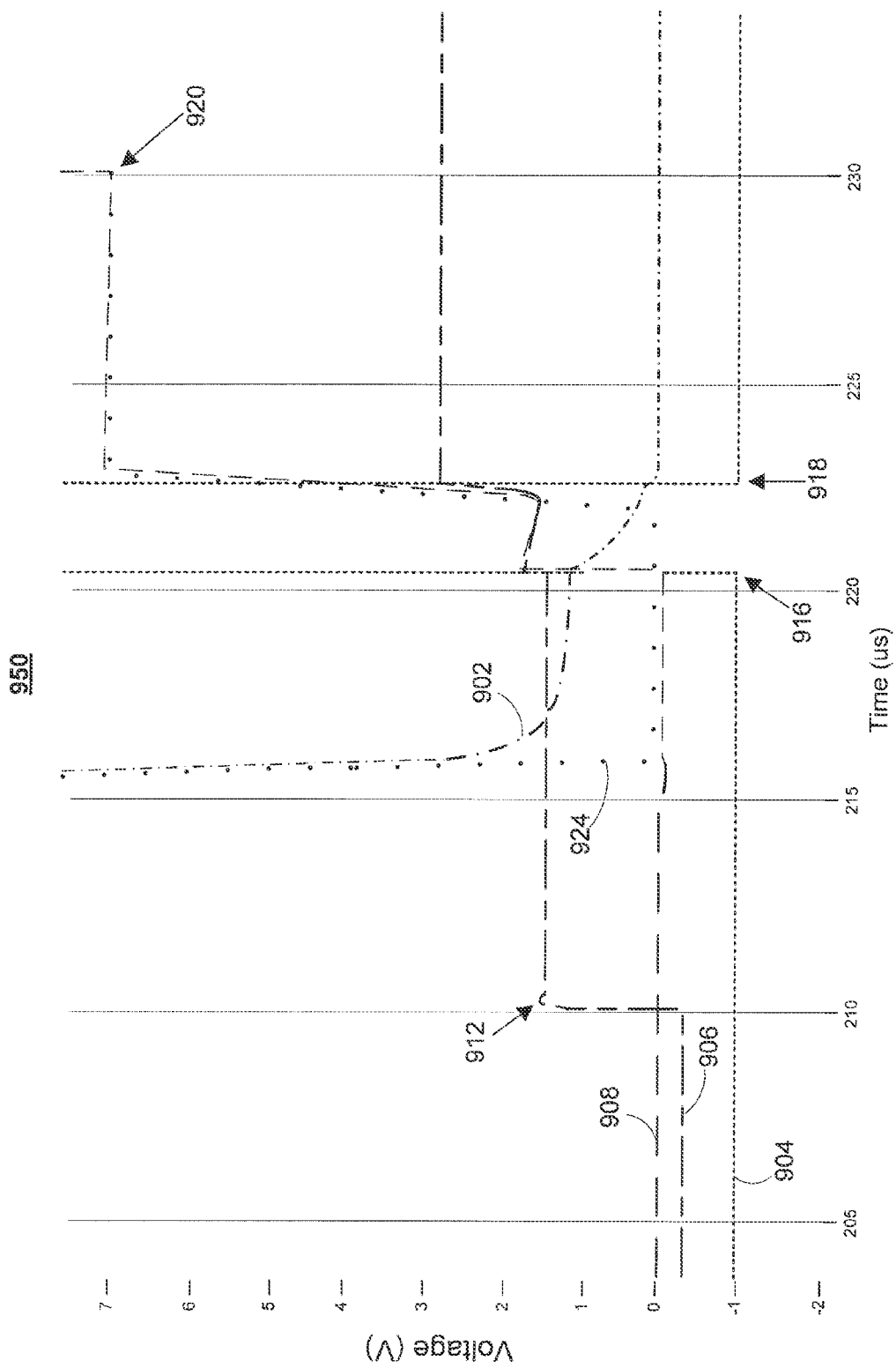
FIG. 9B is a chart of voltage transition detail during pixel actuation, according to an illustrative embodiment of the invention.

FIG. 9B is a chart 950 showing the transition detail of the voltage variations vs. time from chart 900, according to an illustrative embodiment of the invention. Chart 950 shows a close-up of the voltage transitions adjacent and during the activation of the update line at event 916. Chart 950 further includes plot 924 representing the voltage variation vs. time on actuate line 506. As illustrated in chart 950, the voltage in plot 924 starts to increase toward an intermediate level after event 916 when the update line 522 is activated (step 574), and slightly before event 918, when the update line 522 is inactivated (step 578).

FIG. 10A is a chart 1000 of the voltage increase on the actuate node during pixel operation, according to an illustrative embodiment of the invention. Specifically, chart 1000 shows the voltage increase on actuate node during step 576 of method 550 as the voltage on the actuate line 506 is ramped up to an intermediate voltage (i.e. approximately 7 volts). FIG. 10B is a chart 1050 of the latch current transient of the coupled transistors during the voltage ramp-up of chart 1000, according to an illustrative embodiment of the invention. Specifically, chart 1050 shows the current from the power supply that provides power to the actuate line 506. Chart 1050 shows that only approximately 650 fCoulombs of charge flow when applying an intermediate voltage to the actuate line (step 576).

FIG. 11A is a chart 1100 of the voltage increase on an actuator node during pixel operation, according to another illustrative embodiment of the invention. Specifically, chart 1100 shows the voltage increase on the actuate node during step 576 of method 550 as the voltage on the actuate line 506 is ramped up to full voltage (i.e. approximately 25 volts). FIG. 11B is a chart 1150 of the latch current transient of the coupled transistors during the voltage ramp-up of chart 1100, according to an illustrative embodiment of the invention. Specifically, chart 1150 shows the current from the power supply that provides power to the actuate line 506. Chart 1150 shows that approximately 8000 fCoulombs of charge flow when applying the full voltage to the actuate line (step 576), considerably more than that shown in chart 1050 when an intermediate voltage is applied to the actuate line 506. Thus, the intermediate voltage stage applied in step 576 of method 550 provides considerable amount of power savings, while still causing the cross-coupled inverters to latch in the correct state.

The invention may be embodied in other specific forms without departing from the spirit or essential characteristics thereof. The forgoing embodiments are therefore to be considered in all respects illustrative, rather than limiting of the invention.

What is claimed is:

1. A display apparatus comprising:
   at least one actuation line interconnect;
   at least one data line interconnect;
   an array of pixels, each pixel in the array of pixels comprising:
   a Microelectromechanical Systems (MEMS)-based light modulator a first actuator and a second actuator, the first and the second actuators capable of controlling an optical state of the MEMS-based light modulator; and
   a dual inverter latch including:
   a first inverter including;
   a first input electrically coupled to receive a data voltage provided by the at least one data line interconnect, and
   a first output electrically coupled with the first actuator, the first output being further coupled to receive an actuation voltage provided by the at least one actuation line interconnect, and
   wherein the first inverter is configured to control a logical state on the first actuator based on the data voltage and the actuation voltage; and
   a second inverter cross-coupled with the first inverter and including;
   a second input electrically coupled with the first output, and
   a second output electrically coupled with the second actuator, the second output being further coupled to the first input, and
   wherein the second inverter is configured to maintain a logical state on the second actuator at a logical value opposite of a logical value of the logical state on the first actuator.

2. The display apparatus of claim 1, further including a transparent substrate, the array of pixels being on or over the transparent substrate.

3. The display apparatus of claim 1, wherein each pixel further includes a cascode circuit electrically coupled with at least one of the first inverter or the second inverter.

4. The display apparatus of claim 1, wherein each pixel further includes a data store coupled with the first input and capable of storing the data voltage.

5. The display apparatus of claim 4, wherein each pixel further includes an update switch capable of electrically coupling the data store to the first inverter to allow the data voltage to pass from the data store to the first input.

6. The display apparatus of claim 5, further including an update line interconnect capable of supplying a voltage to control the update switches in a plurality of the pixels associated with a plurality of rows and a plurality of columns in the array of pixels.

7. The display apparatus of claim 6, wherein the update switch is capable of electrically decoupling the data store from the first inverter responsive to a voltage supplied by the update line interconnect to prevent current from flowing between the data store and the dual inverter latch.

8. The display apparatus of claim 6, wherein the actuation line interconnect is further capable of providing an intermediate voltage to the first and the second inverters to latch the logical states on the first and the second actuators based on the data voltage.

9. The display apparatus of claim 6, further including
a row line interconnect capable of supplying an enable voltage; and
a data loading switch capable of passing the data voltage to the data store based on the enable voltage.

10. The display apparatus of claim 9, wherein the data store comprises a capacitor, a first input of the capacitor being electrically coupled to the data loading switch and to the update switch, a second input of the capacitor being electrically coupled to a common line interconnect associated with a plurality of rows of pixels in the array of pixels.

11. The display apparatus of claim 10, wherein to update the logical states of the first and the second actuators of the pixel, the controller is capable of:
causing the common line interconnect to supply a common voltage;
causing the actuation line interconnect to supply a voltage approximately equal to the common voltage supplied by the common line interconnect;
causing the update line interconnect to supply the update voltage while the actuation line interconnect supplies the voltage approximately equal to the common voltage;
causing the actuation line interconnect to supply an intermediate voltage while the update line interconnect supplies the update voltage and
causing the update line interconnect to stop supplying the update voltage after causing the actuation line interconnect to supply the intermediate voltage.

12. The display apparatus of claim 11, wherein the update voltage supplied to the update switch causes the update switch to enable the data voltage to pass
from the data store to the dual inverter latch.

13. The display apparatus of claim 11, wherein to actuate the first or the second actuator, the controller is capable of causing the actuate line interconnect to supply the actuation voltage after causing the update line interconnect to stop supplying the update voltage.

14. The display apparatus of claim 9, further including a controller capable of:
controlling the data voltage supplied by the data line interconnect;
controlling the voltage supplied by the row line interconnect;
controlling the voltage supplied by the update line interconnect; and
controlling the voltage supplied by the actuation line interconnect.

15. The display apparatus of claim 14, wherein the controller is capable of loading data into the data store of a pixel in a particular row and a particular column of the array of pixels by:
causing the row line interconnect associated with the particular row to supply the enable voltage to the data loading switch in the pixel;
determining a next optical state of the MEMS-based light modulator in the pixel; and
causing the data line interconnect associated with the particular column to supply the data voltage corresponding to the next optical state to the data loading switch.

16. The display apparatus of claim 15, the controller further capable of:
updating the logical states of the first and the second actuators of the pixel based at least in part on the loaded data such that a full actuation voltage is applied to only one of the first and the second actuators.

17. The display apparatus of claim 9, wherein the data store comprises a capacitor, a first input of the capacitor being electrically coupled to the data loading switch and to the update switch, a second input of the capacitor being electrically coupled to a row line interconnect associated with a next row in the array of pixels next to the particular row.

18. The display apparatus of claim 9, wherein the data store comprises a capacitor, a first input of the capacitor being electrically coupled to the data loading switch and to the update switch, a second input of the capacitor being electrically coupled to a shutter line interconnect associated with the MEMS-based light modulator.

19. The display apparatus of claim 1, wherein each MEMS-based light modulator includes a movable element capable of movement responsive to actuation of at least one of the first or the second actuators between a first optical state enabling light to pass through the light modulator and a second optical state disabling light from passing through the light modulator.

20. The display apparatus of claim 19, wherein:
the first actuator is capable of moving the movable element to the first optical state when the logical state on the first actuator is a first logical state; and
the second actuator is capable of moving the movable element to the second optical state when the logical state on the second actuator is the first logical state.

21. The display apparatus of claim 20, further including a substrate including an array of apertures, wherein the movable element includes a shutter over at least one aperture in the array of apertures, the shutter capable of transverse movement responsive to the first and the second actuators along a plane parallel to the substrate between the first optical state and the second optical state.

* * * * *